(12) United States Patent
Park

(10) Patent No.: US 11,417,660 B2
(45) Date of Patent: Aug. 16, 2022

(54) SEMICONDUCTOR DEVICE AND METHOD FOR FABRICATING THE SAME

(71) Applicant: SK hynix Inc., Gyeonggi-do (KR)

(72) Inventor: Hyung-Jin Park, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/719,003

(22) Filed: Dec. 18, 2019

(65) Prior Publication Data

US 2020/0395362 A1    Dec. 17, 2020

(30) Foreign Application Priority Data

Jun. 14, 2019 (KR) .................. 10-2019-0070998

(51) Int. Cl.
*H01L 27/108* (2006.01)
*G11C 5/06* (2006.01)

(52) U.S. Cl.
CPC ........ *H01L 27/10814* (2013.01); *G11C 5/063* (2013.01); *H01L 27/10826* (2013.01); *H01L 27/10855* (2013.01); *H01L 27/10879* (2013.01); *H01L 27/10885* (2013.01); *H01L 27/10891* (2013.01)

(58) Field of Classification Search
CPC ......... H01L 27/10814; H01L 27/10855; H01L 27/10805
See application file for complete search history.

(56) References Cited

U.S. PATENT DOCUMENTS

| 9,490,264 B2 | 11/2016 | Mazure et al. | |
| 2013/0043525 A1* | 2/2013 | Yu | H01L 27/10885 257/329 |
| 2016/0056159 A1* | 2/2016 | Kim | H01L 27/10876 257/532 |
| 2019/0189618 A1* | 6/2019 | Liu | H01L 27/10855 |

* cited by examiner

*Primary Examiner* — Sarah K Salerno
(74) *Attorney, Agent, or Firm* — IP & T Group LLP

(57) ABSTRACT

A semiconductor device includes a stacked line structure including a bit line over a substrate, an active layer positioned at a higher level than the stacked line structure and parallel to the bit line, a capacitor positioned at a higher level than the active layer, a first plug extending downwardly to be coupled to the bit line through the active layer, a second plug formed between the active layer and the capacitor, and a word line extending in a direction that intersects with the bit line while intersecting with the active layer.

19 Claims, 28 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2019-0070998, filed on Jun. 14, 2019, which is incorporated herein by reference in its entirety.

BACKGROUND

1. Field

Various embodiments of the present invention relate to a semiconductor device, and more particularly, to a semiconductor device including buried bit lines and a method for fabricating the semiconductor device.

2. Description of the Related Art

Recently, in order to increase a net die of a memory device, the size of a memory cell is continuously reduced.

As the size of the memory cell becomes finer, parasitic capacitance Cb should be reduced and capacitance should be increased.

However, it is difficult to increase a net die due to the structural limitation of a memory cell.

SUMMARY

Embodiments of the present invention are directed to a semiconductor device including a highly integrated memory cell and a method for fabricating the semiconductor device.

In accordance with an embodiment of the present invention, a semiconductor device includes: a stacked line structure including a bit line, the stacked line structure positioned over a substrate; an active layer positioned at a higher level than the stacked line structure and parallel to the bit line; a capacitor positioned at a higher level than the active layer; a first plug extending through the active layer to be coupled to the bit line; a second plug formed between the active layer and the capacitor to couple the active layer to the capacitor; and a word line extending in a direction that intersects with the bit line while intersecting with the active layer. The semiconductor device may further include an isolation layer surrounding sidewalls of the active layer. The isolation layer may include a first isolation layer including an air gap positioned on both sidewalls of the stacked line structure; and a second isolation layer formed on a second pair of sidewalls of the active layer, wherein the first isolation layer extends to cover a first pair of sidewalls of the active layer. The stacked line structure includes a plurality of stacked line structures, and the first isolation layer is disposed between the stacked line structures. The active layer includes a plurality of active layers, and the second isolation layer is disposed between the active layers. The second plug includes a pair of second plugs are apart from each other, and the second plugs are directly contacted with the active layer. The word line includes a planar gate, a fin gate, a vertical gate, or a buried gate.

In accordance with yet another embodiment of the present invention, a method for fabricating a semiconductor device includes: preparing a plurality of stacked line structures each of which includes a bit line and a line-type active layer over a substrate; forming a plurality of island-type active layers by cutting the line-type active layer; forming a first plug which is coupled to the bit line through the island-type active layers; forming a word line over the island-type active layers; forming a second plug which is coupled to both sides of each of the island-type active layers; and forming a plurality of capacitors that are respectively coupled to the second plugs.

These and other features and advantages of the present invention will become apparent to those skilled in the art of the invention from the following detailed description in conjunction with the following drawings.

DETAILED DESCRIPTION

Figure 1A:
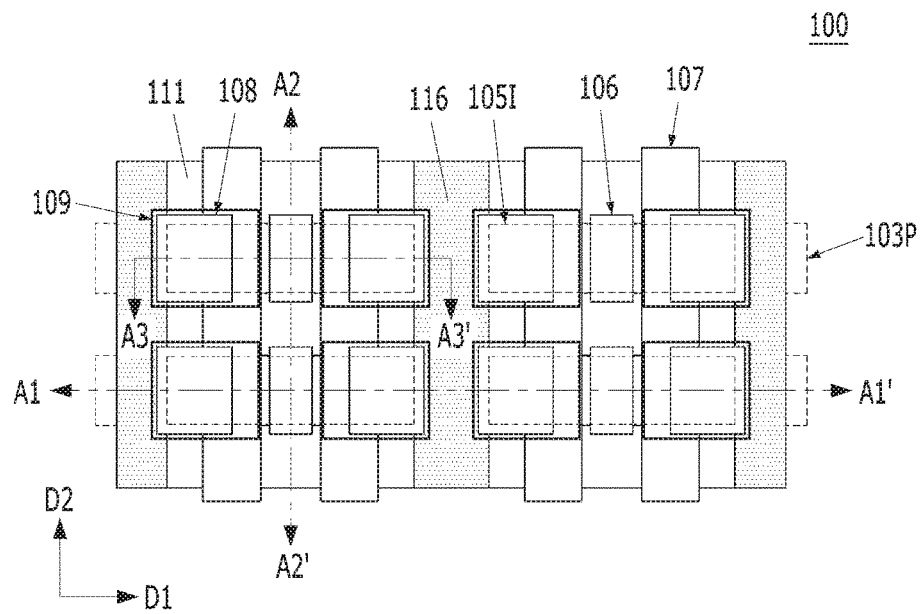
FIGS. 1A to 1D illustrate a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It should be understood that the drawings are simplified schematic illustrations of the described devices and may not include well known details for avoiding obscuring the features of the invention. Also, the drawings are not necessarily to scale and, in some instances, proportions may have been exaggerated in order to clearly illustrate features of the embodiments.

It is further noted that when a first layer is referred to as being "over" a second layer or "over" a substrate, it not only refers to a case where the first layer is formed directly on the second layer or the substrate but also a case where a third layer exists between the first layer and the second layer or the substrate. When a first layer is referred to as being "on" a second layer or "on" a substrate, it refers to a case where the first layer is formed directly on the second layer or the substrate.

It should also be noted that features present in one embodiment may be used with one or more features of another embodiment without departing from the scope of the invention.

In the following embodiments of the present invention, an area for forming a capacitor may be sufficiently secured over the word line by using a self-aligned buried bit line.

Also, a memory cell including a buried bit line may be formed by using a fully-depleted Silicon-On-Insulator (FD-SOI) substrate as a base.

The present invention makes it possible to further reduce the layout area required to form a 1T1C (1-transistor-1-capacitor) structure. The present invention may be useful in realizing an 4F2 DRAM memory cell.

Figure 1B:
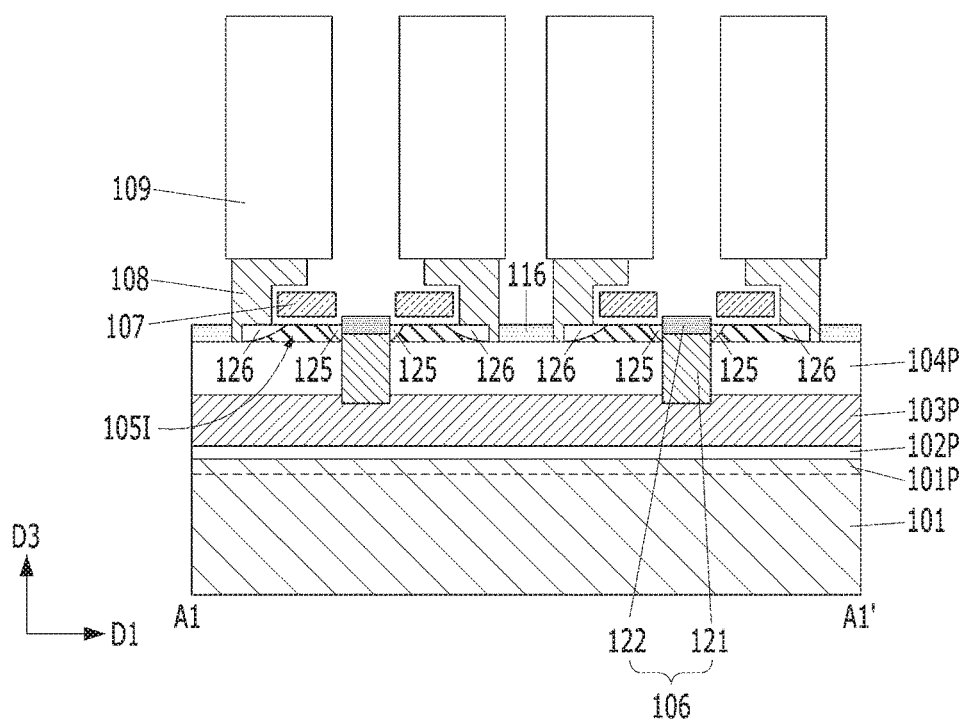
Figure 1C:
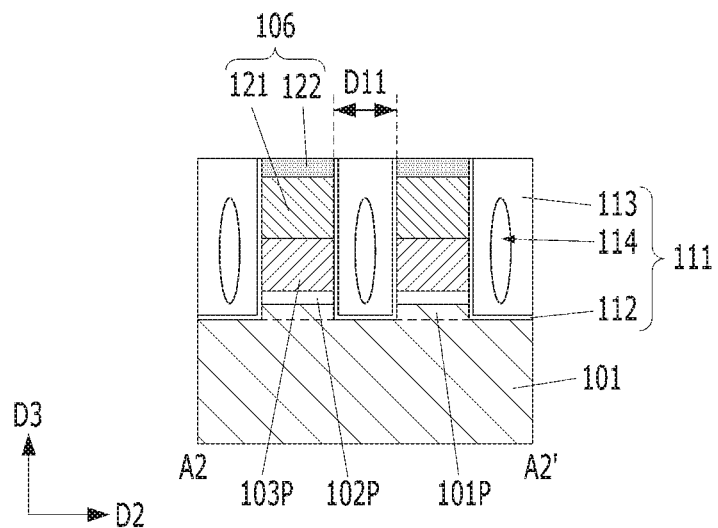
Figure 1D:
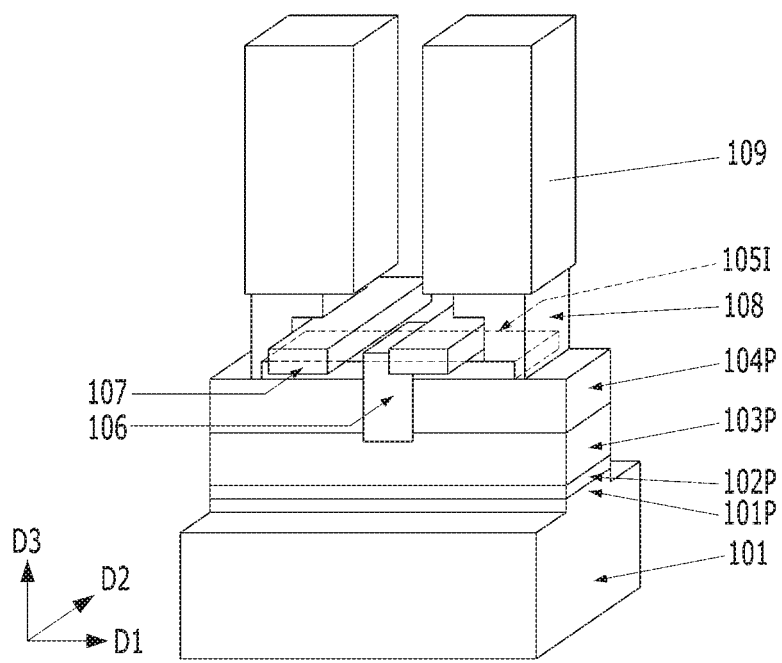

FIGS. 1A to 1D illustrate a semiconductor device in accordance with an embodiment of the present invention. FIG. 1A is a plane view of the semiconductor device, FIG. 1B is a cross-sectional view taken along a line A1-A1' of FIG. 1A, FIG. 1C is a cross-sectional view taken along a line A2-A2' of FIG. 1A, and FIG. 1D is a perspective view taken along a line A3-A3' of FIG. 1A.

Referring to FIGS. 1A to 1D, the semiconductor device 100 may be portion of a memory cell array. The semiconductor device 100 may include a plurality of memory cells. Each memory cell may include a bit line 103P, a transistor including an active layer 105I which is positioned at a higher level than the bit line 103P, and a capacitor 109 which is positioned at a higher level than the transistor. The transistor may include the active layer 105I and a word line 107. A pair of word lines 107 that are parallel to each other may be disposed over the active layer 105I. The pair of word lines 107 may intersect with the active layer 105I.

A buried dielectric line 104P may be formed between the bit line 103P and the active layer 105I. The semiconductor device 100 may further include a through plug 106 coupled to a bit line 103P through the active layer 105I and a pair of vertical plugs 108 respectively coupled to both sides of the active layer 105I. The through plug 106 may extend downwardly from a level above the level of the top surface of the active layer 105I through the active layer 105I and through the buried dielectric line 104P to contact the bit line 103P. The bottom surface of the through plug 106 may be in contact with the bit line 103P. The bottom surface of the through plug 106 may be at a level that is lower than the top surface of the bit line 103P. The vertical plug 108 may extend upwardly from a surface of the active layer 105I.

The bit line 103P may extend along in a first direction D1, and the word line 107 may extend along in a second direction D2. The first and second directions D1 and D2 may be perpendicular to one another and may define a plane that is parallel to the top surface of the substrate 101. Thus, when viewed from the top the bit line 103P and the word line 107 may vertically intersect with each other, but may not contact each other since the word lines 107 are formed at a level that is higher than the level of the bit lines 103P. The active layer 105I may be formed over the bit line 103P. The active layer 105I and the bit line 103P may vertically overlap with each other in a third direction D3 that is perpendicular to the plane defined by the first and the second directions D1 and D2.

The through plug 106 may be a stacked structure of a metal plug 121 and a silicon plug 122. The silicon plug 122 may be formed on the metal plug 121. The metal plug 121 may be formed of a metal-based material. For example, the metal plug 121 may include titanium, titanium nitride, tungsten nitride, tungsten, titanium silicide, tungsten silicide, or a combination thereof. The silicon plug 122 may include polysilicon. For example, the silicon plug 122 may include doped polysilicon which is doped with an N-type impurity, such as phosphorous and arsenic. The through plug 106 may be in direct contact with the active layer 105I and the bit line 103P. The active layer 105I and the bit line 103P may be electrically connected to each other through the through plug 106. The top surface of the through plug 106 may be positioned at a lower level than the word line 107. The top surface of the through plug 106 may be positioned at a level which is about the same or slightly lower than the bottom level of the word line 107.

A buffer line 102P may be formed below the bit line 103P, and a bulk substrate 101 may be formed below the buffer line 102P. The buffer line 102P, the bit line 103P, and the buried dielectric line 104P may be sequentially stacked over the bulk substrate 101. In an embodiment, the buffer line 102P and the buried dielectric line 104P may include silicon oxide. The bit line 103P may have a shape buried between the buried dielectric line 104P and the buffer line 102P. The bit line 103P and the bulk substrate 101 may be insulated from each other by the buffer line 102P.

The buffer line 102P, the bit line 103P, and the buried insulation line 104P may have the same shape. The buffer line 102P, the bit line 103P, and the buried insulation line 104P may be coextensive in the first and the second directions D1 and D2. From the perspective of a top view, the buffer line 102P, the bit line 103P, and the buried dielectric line 104P may have a line shape extending in the first direction D1. The buffer line 102P, the bit line 103P, and the buried dielectric line 104P may have the same width which is defined as their dimension in the second direction D2. This structure wherein the bit line 103P is positioned between the buffer line 102P and the buried dielectric line 104P, may be referred to also as a buried bit line structure and the bit line 103P may be referred to as a buried bit line.

A protrusion 101P protruding from the bulk substrate 101 may be formed below the buffer line 102P. The protrusion 101P and the bulk substrate 101 may be include the same material. The protrusion 101P may be formed by a partial etching of the bulk substrate 101. The protrusion 101P may have the same shape as the buffer line 102P, the bit line 103P, and the buried dielectric line 104P. The protrusion 101P may have a shape extending in the first direction D1. A distance all between the neighboring protrusions 101P may be large enough to block the interference between the neighboring bit lines 103P.

A first isolation layer 111 may be formed between the neighboring bit lines 103P. The first isolation layer 111 may include a protective material 112, an isolation material 113, and an air gap 114. The protective material 112 may include silicon oxide. The isolation material 113 may include a low dielectric material. The isolation material 113 may include silicon oxide, silicon nitride, or a combination thereof. The air gap 114 may be formed in the isolation material 113. The air gap 114 may reduce parasitic capacitance between the neighboring bit lines 103P. A second isolation layer 116 may be formed between the neighboring active layers 105I.

A plurality of active layers 105I may be formed over one bit line 103P. The neighboring active layers 105I may be spaced apart from each other. Each active layer 105I may be of an island-shape. Each active layer 105I may be rectangular or elliptical from the perspective of a top view. The widths of each active layer and the width of the bit line 103P in the second direction D2 may be the same. Each active layer 105I may include a first source/drain region 125 coupled to the through plug 106 and a second source/drain region 126 coupled to the vertical plug 108. The first source/drain regions 125 may be in direct contact with the through plugs 106 and the second source/drain regions 126 may be in direct contact to the vertical plugs 108. Since the buried dielectric line 104P is positioned between the active layer 105I and the bit line 103P, a transistor including the active layer 105I may be formed over the SOI substrate base. Also, the active layer 105I may be insulated from the bit line 103P by the buried dielectric line 104P, the first isolation layer 111, and the second isolation layer 116. The buried dielectric line 104P may be thicker than the active layer 105I. Accordingly, the transistor including the active layer 105I may be formed over the FDSOI (fully depleted silicon on oxide) substrate base.

The word lines 107 may extend in the second direction D2 intersecting with the bit lines 103P and the active layers 105I. The word lines 107 may be formed over corresponding active layers 105I. Each word line 107 may be positioned over the active layer 105I between the through plug 106 and the vertical plug 108. A pair of word lines 107 may be positioned over one active layer 105I between two vertical plugs 108.

The bottom end of each vertical plug 108 may have a corner bracket shape contacting a corner edge of the corresponding active layer 105I. The bottom end of each vertical plug 108 may have a corner bracket shape having a horizontal portion and a vertical portion. Specifically the bottom surface of the horizontal portion of the bottom end of each vertical plug 108 may contact the top surface of the corresponding active layer 105I. The vertical portion of the bottom end of each vertical plug 108 may penetrate the second isolation layer 116 to contact the buried dielectric line 104P and the side edge of the corresponding active layer 105I. The upper end of the vertical plug 108 may extend in the first direction D1 to partially overlap with the corresponding word line 107 in the vertical direction D3 without contacting the corresponding word line 107. The vertical plug 108 may include polysilicon having an N-type impurity. The first and second source/drain regions 125 and 126 may include an impurity diffused from the through plug 106 and the vertical plug 108. For example, when the through plug 106 and the vertical plug 108 include polysilicon doped with an impurity, the impurity from the through plug 106 and the vertical plug 108 may be diffused into the inside of the active layer 105I by annealing or the like.

A capacitor 109 may be formed over each vertical plug 108. The capacitor 109 may be of a three-dimensional structure. For example, the capacitor 109 may be a pillar shape, a cylindrical shape, or a combination thereof. Since the through plug 106 is not positioned between the neighboring capacitors 109, the space between the capacitors 109 may be sufficiently narrow. Therefore, a portion of each capacitor 109 may extend to vertically overlap with the corresponding word line 107 by increasing the size of the capacitor 109 in the first direction D1. As a result, since the area of each capacitor 109 may be increased, its capacitance may be increased. In some embodiments of the present invention, the capacitance may be further secured by forming the capacitor 109 as an oval shape.

FIGS. 2A to 13C illustrate a method for fabricating a semiconductor device in accordance with an embodiment of the present invention.

Figure 2A:
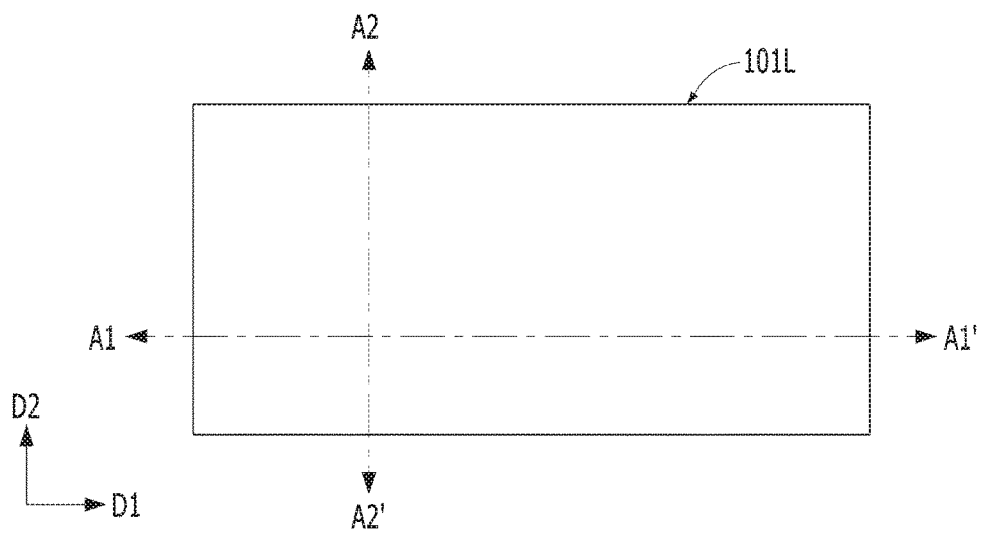
FIGS. 2A to 13C illustrate a method for fabricating a semiconductor device in accordance with an embodiment of the present invention.
Figure 2B:
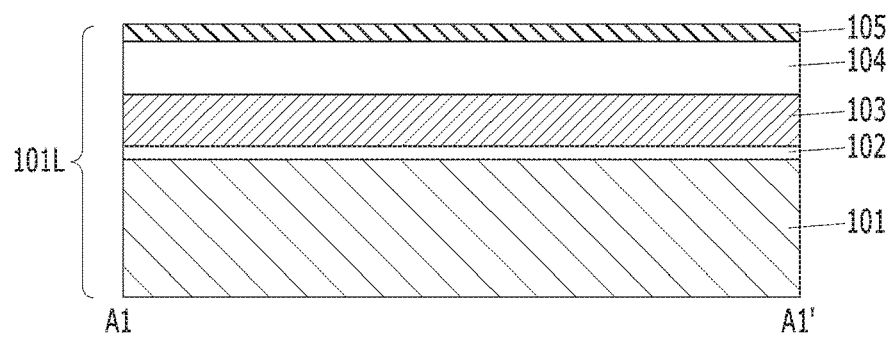
Figure 2C:
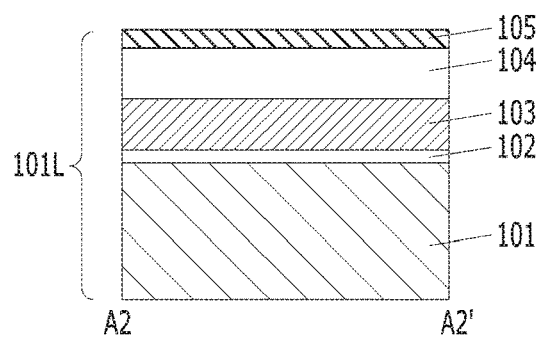

FIG. 2A is a plane view illustrating a substrate stack 101L, FIG. 2B is a cross-sectional view taken along a line A1-A1' shown in FIG. 2A, and FIG. 2C is a cross-sectional view taken along a line A2-A2' shown in FIG. 2A.

Referring to FIGS. 2A to 2C, the substrate stack 101L including a buried conductive material 103 may be prepared. The substrate stack 101L may be stacked in the order of a bulk substrate 101, a buffer material 102, a buried conductive material 103, a buried dielectric material 104, and a semiconductor material 105. The bulk substrate 101 may include bulk silicon. The buried conductive material 103 may include a low resistance material. For example, the buried conductive material 103 may include a semiconductor material, a metal, a metal nitride, a metal silicide, or a combination thereof. In an embodiment of the present invention, the buried conductive material 103 may include a metal, for example tungsten. In another embodiment of the present invention, the buried conductive material 103 may include a stack of titanium nitride and tungsten. In yet another embodiment, the buried conductive material 103 may include a 'TiN/W/TiN' stack in which a first titanium nitride, tungsten, and a second titanium nitride are sequentially stacked. The semiconductor material 105 may include polysilicon. The buffer material 102 and the buried dielectric material 104 may include a dielectric material. The buffer material 102 and the buried dielectric material 104 may include silicon oxide.

A method of forming the substrate stack 101L will be described later with reference to FIGS. 14A to 14D.

Figure 3A:
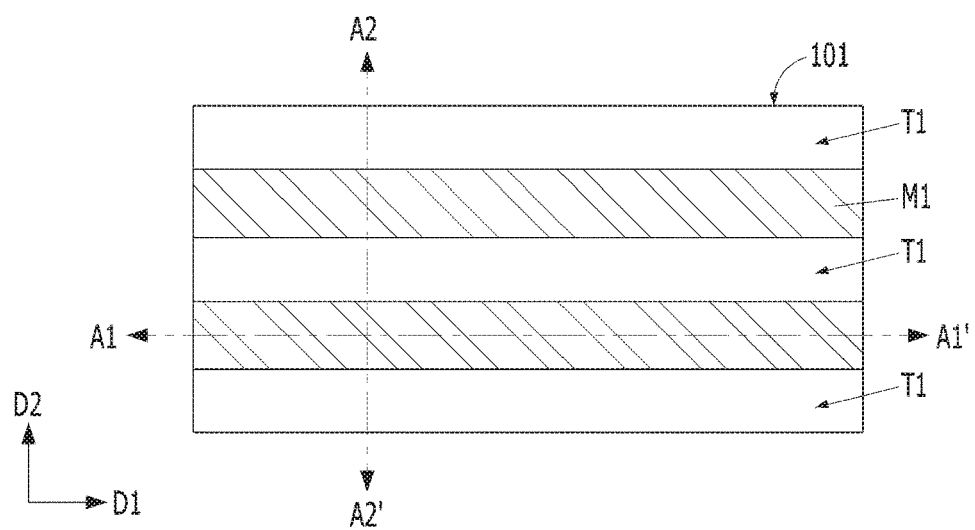
Figure 3B:
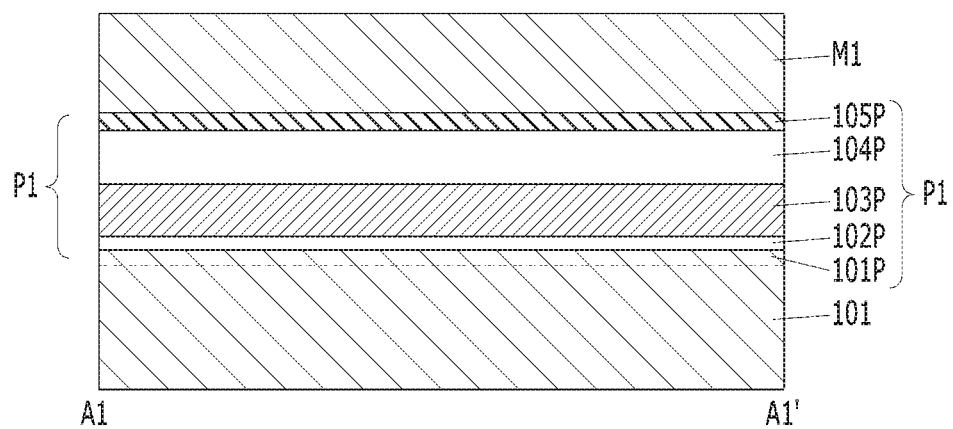
Figure 3C:
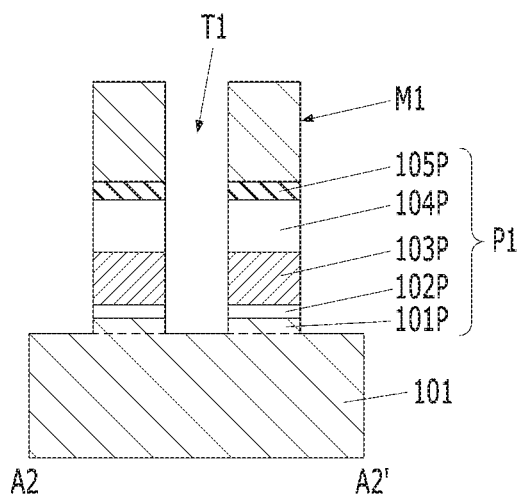

FIG. 3A is a plane view illustrating an etch process of a substrate stack by using a first mask, FIG. 3B is a cross-sectional view taken along the line A1-A1' shown in FIG. 3A, and FIG. 3C is a cross-sectional view taken along the line A2-A2' shown in FIG. 3A.

Referring to FIGS. 3A to 3C, a first mask M1 may be formed over the substrate stack 101L. The first mask M1 may include a photoresist pattern. The first mask M1 may have a line and space shape. For example, the first mask M1 may include a plurality of mask lines extending in the first direction D1. The mask lines may be formed spaced apart from each other in the second direction D2. The lower semiconductor material 105 in the lower portion may be partially exposed by the spacing between the mask lines.

A portion of the substrate stack 101L may be etched using the first mask M1. The semiconductor material 105, the buried dielectric material 104, the buried conductive material 103, and the buffer material 102 may be sequentially etched. After the buffer material 102 is etched, the top surface of the bulk substrate 101 may be partially recessed.

As a result of the etch process, which is described above, stacked line structures P1 may be formed. The stacked line structures P1 may have a line shape extending in the first direction D1. First trenches T1 may be defined between the stacked line structures P1.

Each of the stacked line structures P1 may be stacked in the order of a buffer line 102P, a buried conductive line 103P, a buried dielectric line 104P, and a semiconductor line 105P. The stacked line structures P1 may further include a protrusion 101P formed below the buffer line 102P by recessing the bulk substrate 101. Each of the buffer line 102P, the buried conductive line 103P, the buried dielectric line 104P, and the semiconductor line 105P may be formed by etching a buffer material 102, a buried conductive material 103, a buried dielectric material 104, and a semiconductor material 105.

Hereinafter, the buried conductive line 103P may be simply referred to as 'a bit line 103P'. The semiconductor line 105P may be cut out in a subsequent process to form active layers 105I. In this respect, the semiconductor line 105P may be referred to as a 'preliminary active layer'.

According to another embodiment of the present invention, the stacked line structures P1 may be patterned in an oblique direction. As a result, the bit line 103P and the semiconductor line 105 may extend in a diagonal direction crossing the first direction D1 and the second direction D2.

Figure 4A:
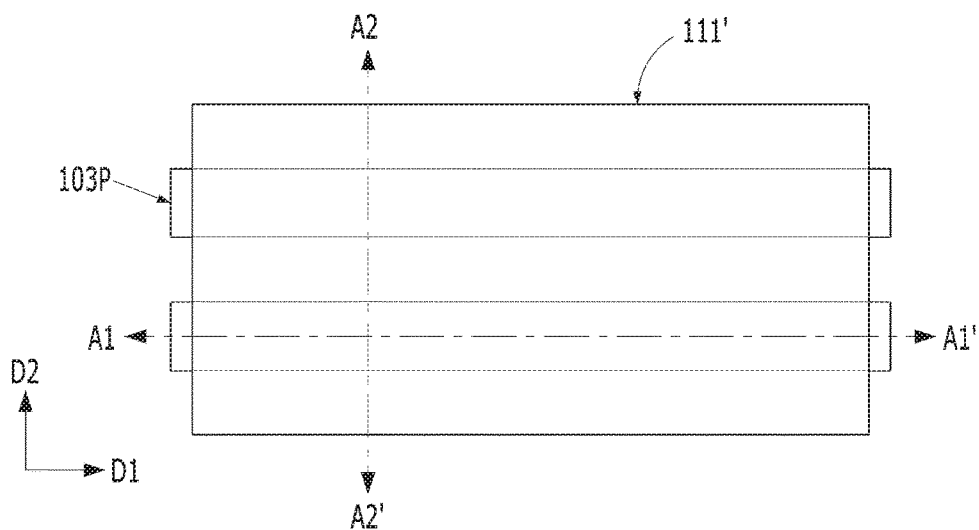
Figure 4B:
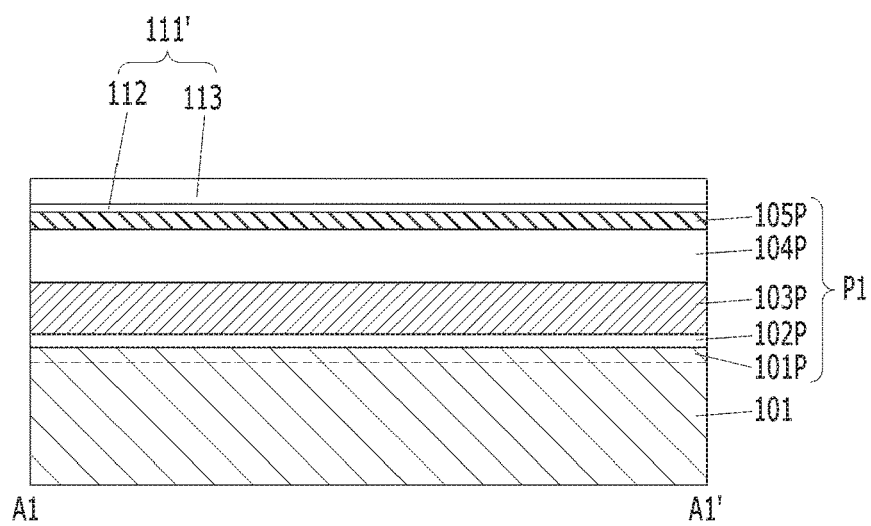
Figure 4C:
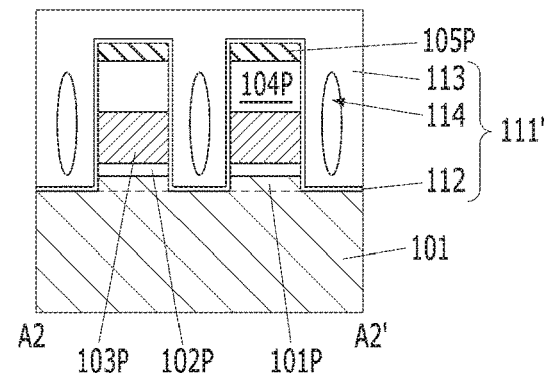

FIG. 4A is a plane view illustrating a process for forming a gap-fill material, FIG. 4B is a cross-sectional view taken along the line A1-A1' shown in FIG. 4A, and FIG. 4C is a cross-sectional view taken along the line A2-A2' shown in FIG. 4A.

Referring to FIGS. 4A to 4C, the first mask M1 may be removed.

Subsequently, a gap-fill material 111' may be formed. The gap-fill material 111' may fill the first trenches T1 between the stacked line structures P1 and may cover the upper portions of the stacked line structures P1. The gap-fill material 111' may include a dielectric material.

The gap-fill material 111' may include a protective material 112, an isolation material 113, and an air gap 114.

The protective material 112 may be conformally formed to line both sidewalls and top surfaces of the stacked line structures P1. The protective material 112 may also cover the exposed top surface of the substrate 101 that is not covered by the stacked line structures P1. The protective material 112 may include ultra-low temperature oxide (ULTO). For example, the protective material 112 may include a silicon oxide. The protective material 112 may be formed by an oxidation process.

An isolation material 113 may be formed on the protective material 112. The isolation material 113 may insulate the neighboring stacked line structures P1 from each other. The isolation material 113 may include silicon oxide, silicon nitride, or a combination thereof. In this embodiment of the present invention, the isolation material 113 may be formed of silicon nitride.

The isolation material 113 may fill the first trenches T1 between the stacked line structures P1 including the protective material 112. The isolation material 113 may include an air gap 114. The air gap 114 may reduce parasitic capacitance between the neighboring stacked line structures P1. In another embodiment, the isolation material 113 may be formed to have an overhang in the upper portion of the stacked line structures P1, and the air gap 114 may be easily formed by the overhang. When the isolation material 113 is formed to have an overhang, the air gap 114 may be adjusted to be positioned between the neighboring bit lines 103P. The overhang may be formed by non-conformal deposition of the isolation material.

The protective material 112 and the isolation material 113 may cover the upper portion of the semiconductor line 105P.

Figure 5A:
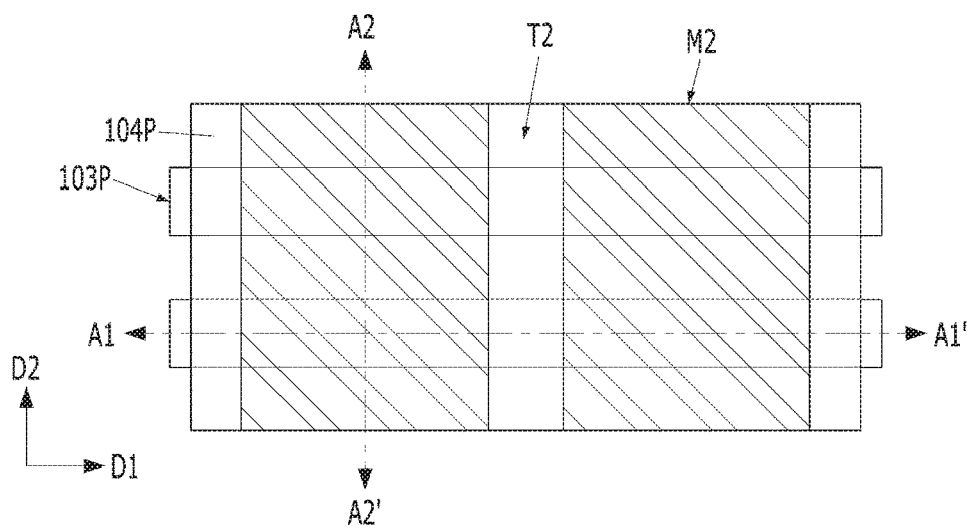
Figure 5B:
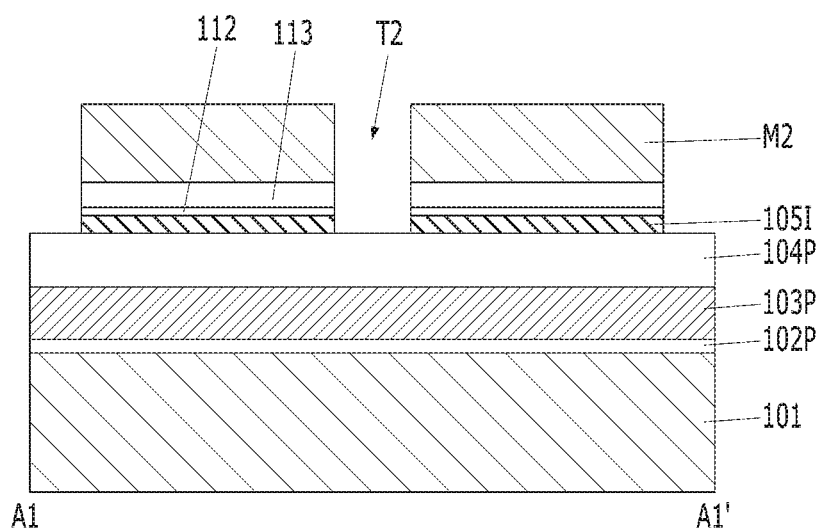
Figure 5C:
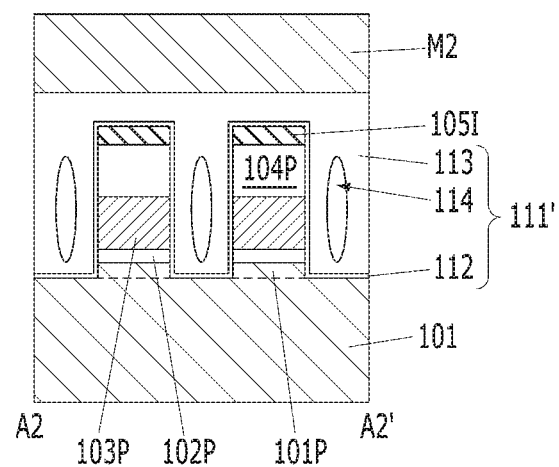

FIG. 5A is a plane view illustrating a cutting process using a second mask, FIG. 5B is a cross-sectional view taken along the line A1-A1' shown in FIG. 5A, and FIG. 5C is a cross-sectional view taken along the line A2-A2' shown in FIG. 5A.

Referring to FIGS. 5A to 5C, a second mask M2 may be formed over the isolation material 113. The second mask M2 may extend in the second direction D2 crossing the stacked line structures P1. The second mask M2 may have a larger width than the stacked line structures P1. The second mask M2 may function as a cut mask. The second mask M2 may include a photoresist pattern.

The cutting process may be performed by using the second mask M2. For example, the semiconductor line 105P may be cut by using the second mask M2 as an etch barrier. A plurality of active layers 105I separated from each other may be formed by cutting the semiconductor line 105P. The active layers 105I may be of an island-type pattern and form a regular array. The cutting process may be performed by a dry etch process.

Before cutting the semiconductor line 105P, the isolation material 113 and the protective material 112 may be etched by using the second mask M2 as an etch barrier.

After the cutting process of the semiconductor line 105P for forming the active layers 105I, a second trench T2 may be formed between the neighboring active layers 105I and the bottom surface of the second trench T2 may expose the buried dielectric line 104P.

The active layers 105I may vertically overlap with the bit line 103P. The buried dielectric line 104P may be positioned between the active layers 105I and the bit line 103P, and the buried dielectric line 104P may electrically insulate the active layers 105I and the bit line 103P from each other.

After the cutting process for forming the active layers 105I, portions of buried dielectric line 104P may be exposed, and the buried dielectric line 104P may remain uncut over the bit line 103P.

Figure 6A:
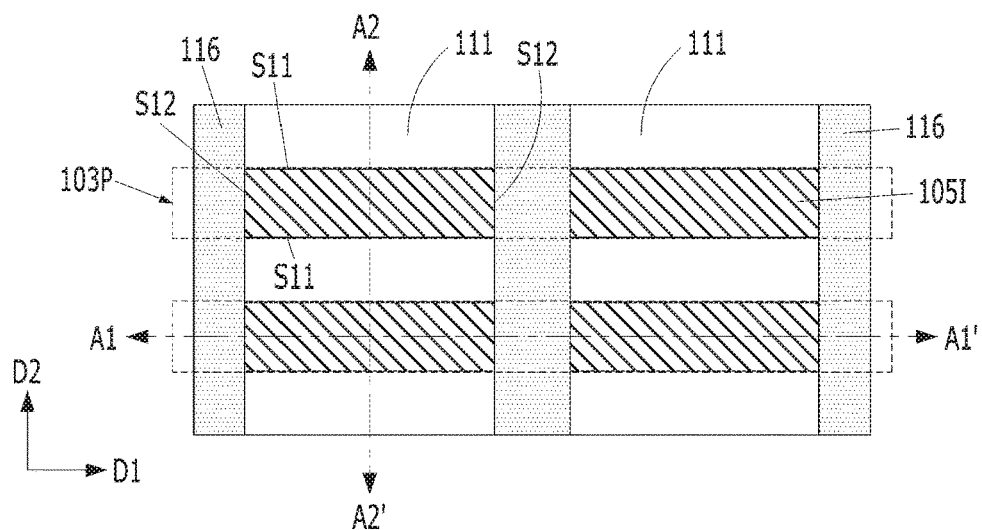
Figure 6B:
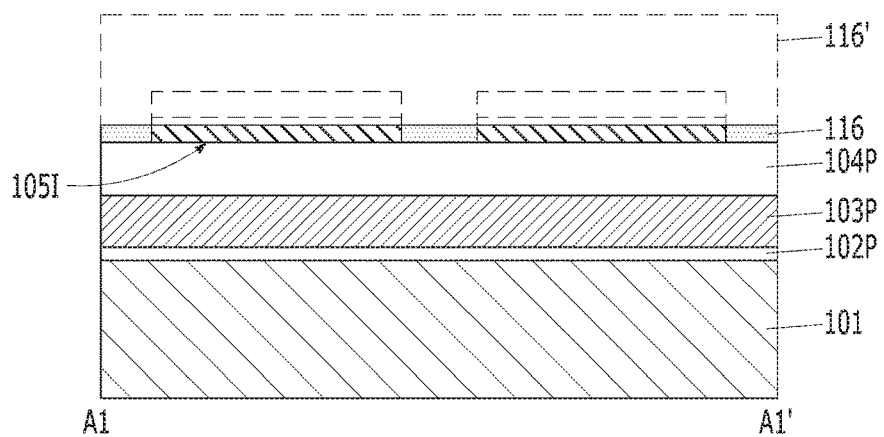
Figure 6C:
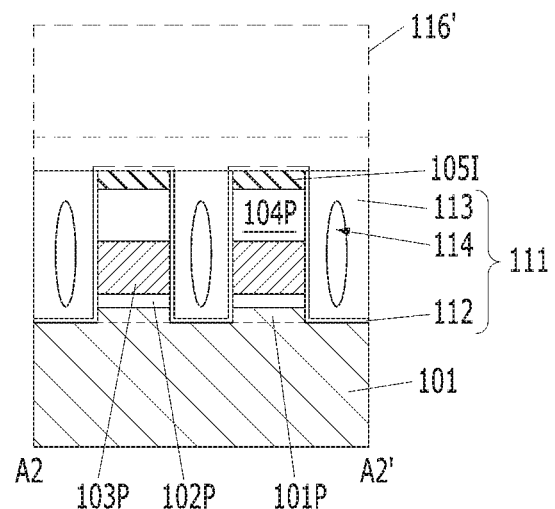

FIG. 6A is a plane view illustrating a process of forming a second isolation layer, FIG. 6B is a cross-sectional view taken along the line A1-A1' shown in FIG. 6A, and FIG. 6C is a cross-sectional view taken along the line A2-A2' shown in FIG. 6A.

Referring to FIGS. 6A to 6C, after the second mask M2 is removed, an isolation oxide 116' filling the second trench T2 may be formed over the active layers 105I. The isolation oxide 116' may gap-fill the second trench T2 between the neighboring active layers 105I, and a portion of the isolation oxide 116' may cover the top surfaces of the active layers 105I. The isolation oxide 116' may include silicon oxide.

Subsequently, the isolation oxide 116' may be planarized. Accordingly, the isolation oxide 116 may remain in the second trench T2 between the neighboring active layers 105I. Hereinafter, the isolation oxide 116 may be referred to as a second isolation layer 116. The second isolation layer 116 may serve to electrically isolate the neighboring active layers 105I from each other.

Planarization of the isolation oxide 116' may be performed such that the top surfaces of the active layers 105I are exposed, and portions of the protective material 112 and the isolation material 113 of the gap-fill material 111' may be removed. Therefore, the gap-fill material 111 whose surface has the same level as the top surfaces of the active layers 105I may remain. Hereinafter, the gap-fill material 111 may be referred to as a first isolation layer 111.

The second isolation layer 116 may remain between the neighboring active layers 105I, both from the perspective of the A1-A1' direction, and from the perspective of the A2-A2' direction.

The bottom surface of the second isolation layer 116 may be in contact with the buried dielectric line 104P. The top surface of the second isolation layer 116 and the top surfaces of the active layers 105I may be positioned at the same level. The first isolation layer 111 and the second isolation layer 116 may be coupled to each other.

The neighboring active layers 105I may be insulated from each other by the first isolation layer 111 and the second isolation layer 116. The active layers 105I may have an island shape isolated by the first isolation layer 111 and the second isolation layer 116. The active layers 105I may overlap with each other perpendicularly to the bit line 103P. A plurality of active layers 105I may be positioned over one bit line 103P along the first direction D1, and may be insulated from each other by the second isolation layer 116. The active layer 105I may be positioned over each bit line 103P along the second direction D2, and the neighboring active layers 105I in the second direction D2 may be insulated from each other by the first isolation layer 111.

Figure 7A:
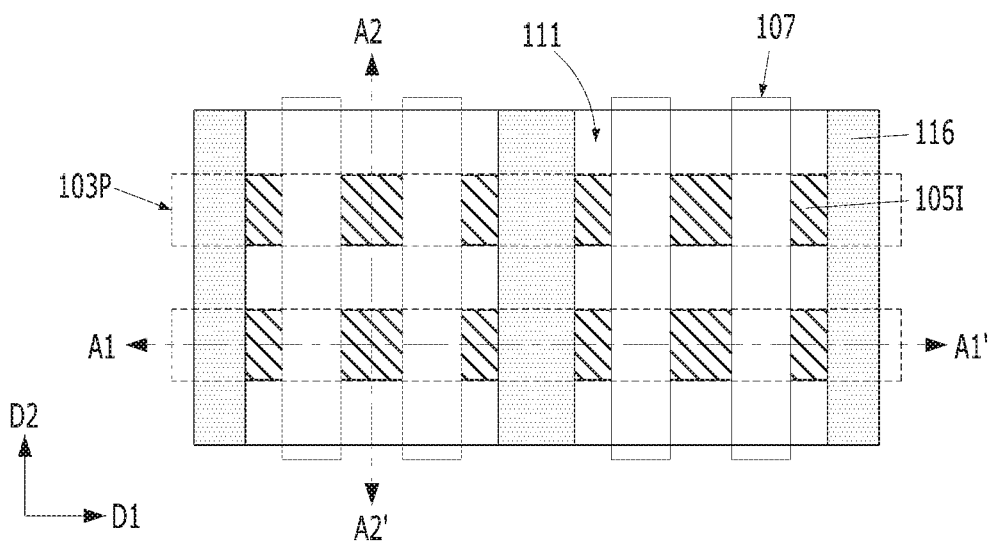
Figure 7B:
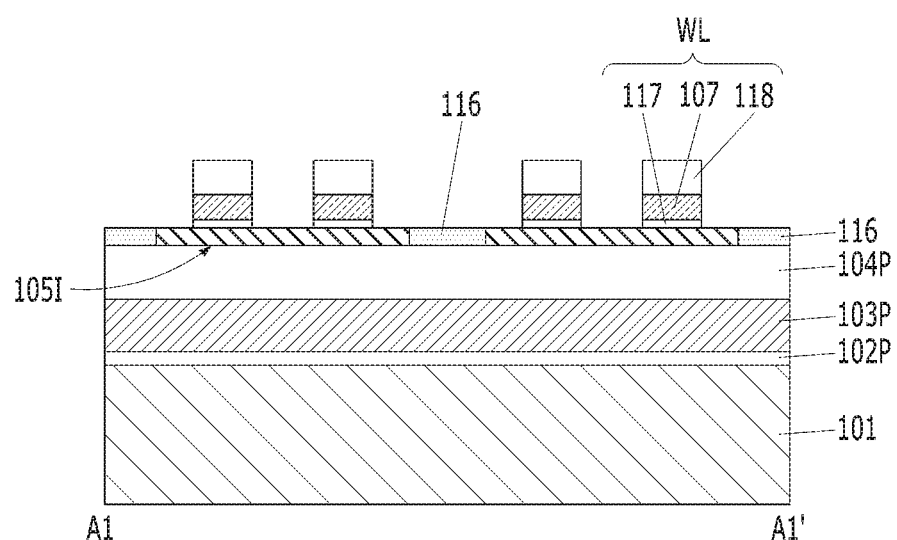
Figure 7C:
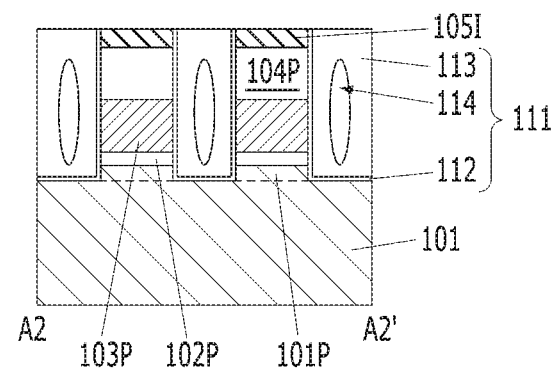

FIG. 7A is a plane view illustrating a gate structure forming process, FIG. 7B is a cross-sectional view taken along the line A1-A1' shown in FIG. 7A, and FIG. 7C is a cross-sectional view taken along the line A2-A2' shown in FIG. 7A.

Referring to FIGS. 7A to 7C, a gate structure WL including a word line 107 may be formed over the active layer 105I. The gate structure WL may include a stack of a gate dielectric layer 117, a word line 107, and a gate capping layer 118.

The upper surface of the active layer 105I may be oxidized to form the gate dielectric layer 117. The word line 107 and the gate capping layer 118 may be formed by stacking a word line conductive material and a gate capping material, and then etching the word line conductive material and the gate capping material by using a gate mask (not shown). The word line 107 may include polysilicon, metal, metal nitride, metal silicide, or a combination thereof. The gate capping layer 118 may include silicon oxide, silicon nitride, or a combination thereof.

The word line 107 may extend in the second direction D2 intersecting with the bit line 103P. A pair of word lines 107 may be positioned over one active layer 105I. A pair of word lines 107 may intersect with a plurality of active layers 105I that are disposed in the second direction D2. The word line 107 may have a planar shape positioned over the active layer 105I. For example, a planar channel may be formed in the active layer 105I by the word line 107.

Figure 8A:
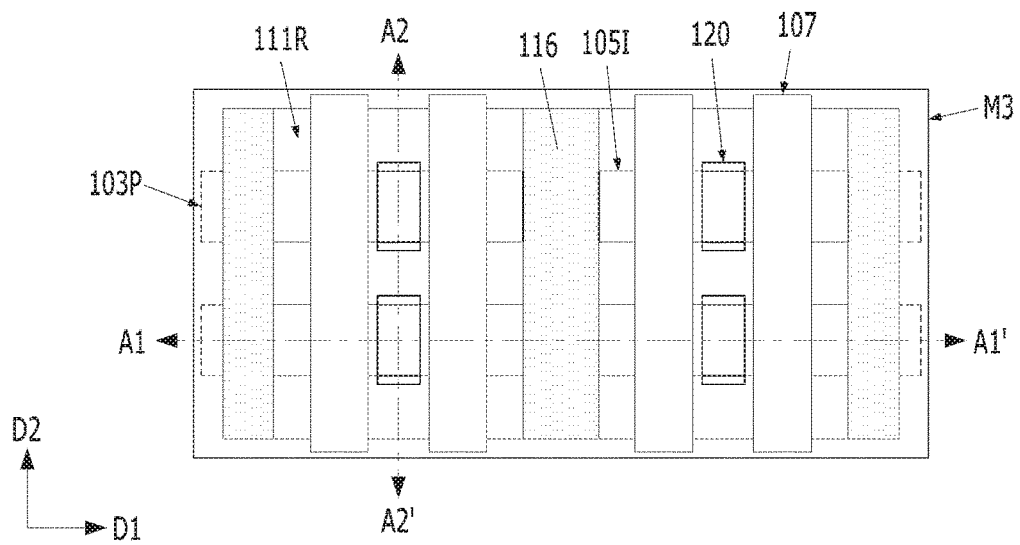
Figure 8B:
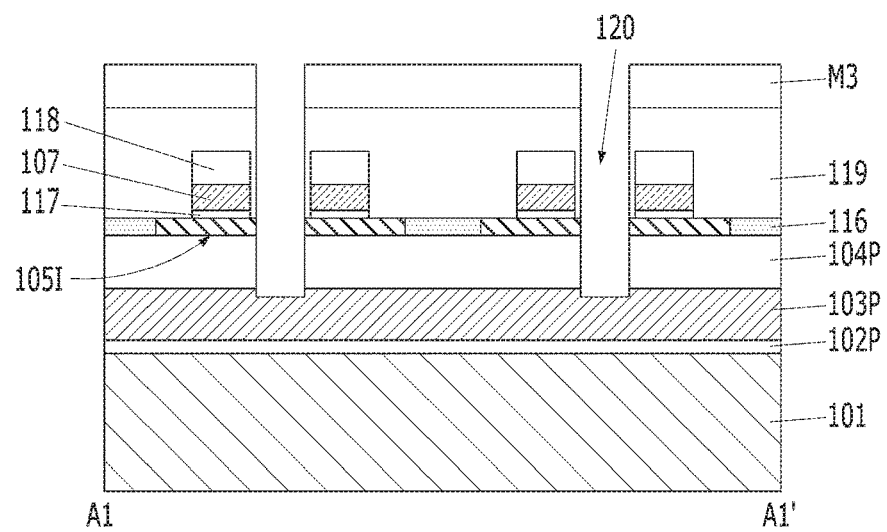
Figure 8C:
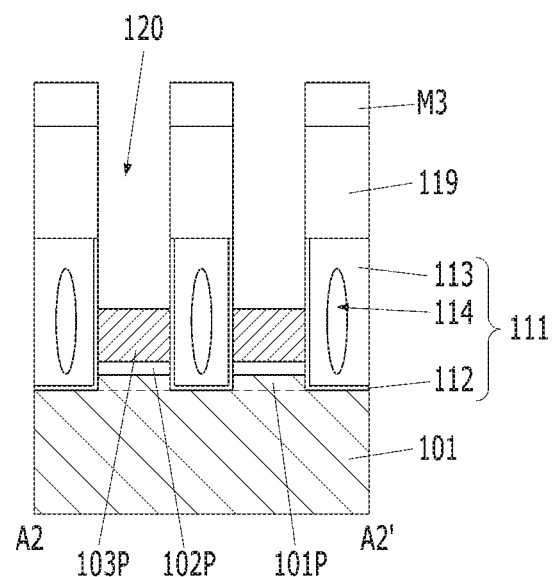

FIG. 8A is a plane view illustrating a first contact hole forming process, FIG. 8B is a cross-sectional view taken along the line A1-A1' shown in FIG. 8A, and FIG. 8C is a cross-sectional view taken along the line A2-A2' shown in FIG. 8A.

Referring to FIGS. 8A to 8C, an inter-layer dielectric material 119 may be formed over and between the gate structure WL. A third mask M3 may be formed over the inter-layer dielectric material 119. The third mask M3 may include a photoresist pattern. The third mask M3 may have an opening corresponding to the first contact hole 120. The opening may be circular.

The inter-layer dielectric material 119 between the gate structures WL may be etched by using the third mask M3. As a result, a first contact hole 120 may be formed corresponding to each of the active layers 105I.

Subsequently, the first contact hole 120 may be extended. The first contact hole 120 may be extended by etching the active layer 105I and the buried dielectric line 104P between the gate structures. As a result, the first contact hole 120 may expose the top surface of the bit line 103P.

Each first contact hole 120 may penetrate its corresponding active layer 105I. Each first contact hole 120 may penetrate the middle portion of its corresponding active layer 105I.

According to another embodiment of the present invention, the third mask M3 may have a line-shaped opening. In this case, an etching process for forming the first contact hole 120 may be performed by being self-aligned with the sidewalls of the gate structure WL and the first isolation layer 111. In other words, the inter-layer dielectric material 119 may be etched in the form of a line through the line-shaped opening of the third mask M3, and the active layer 105I exposed by the etching of the inter-layer dielectric material 119 may be etched by being self-aligned with the sidewalls of the first isolation layer 111. The third mask M3 may have a reverse form of the gate mask for forming the gate structure WL.

Figure 9A:
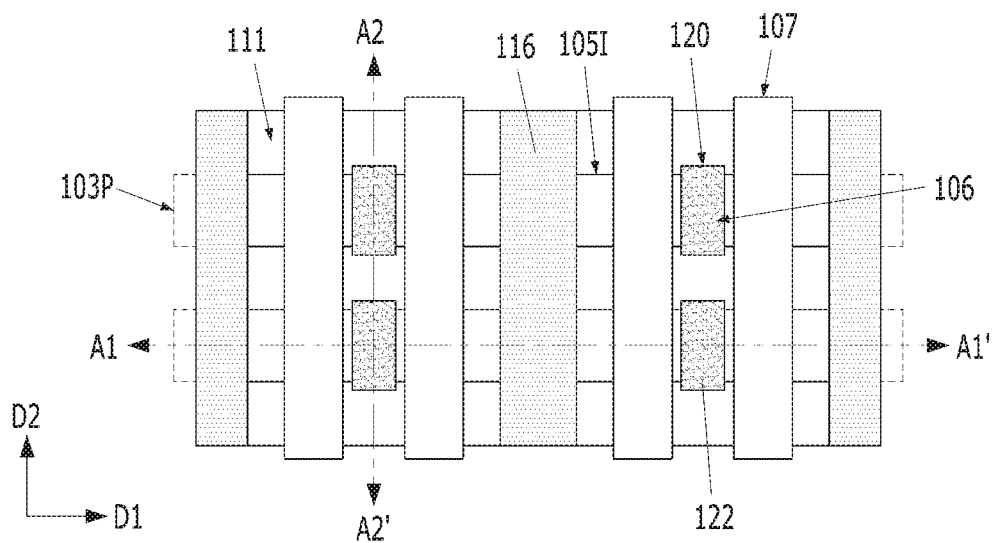
Figure 9B:
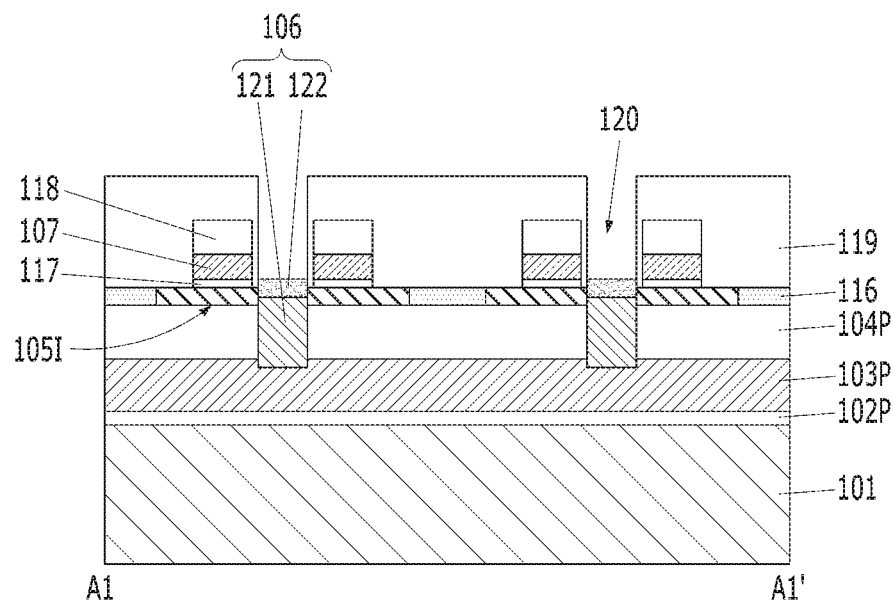
Figure 9C:
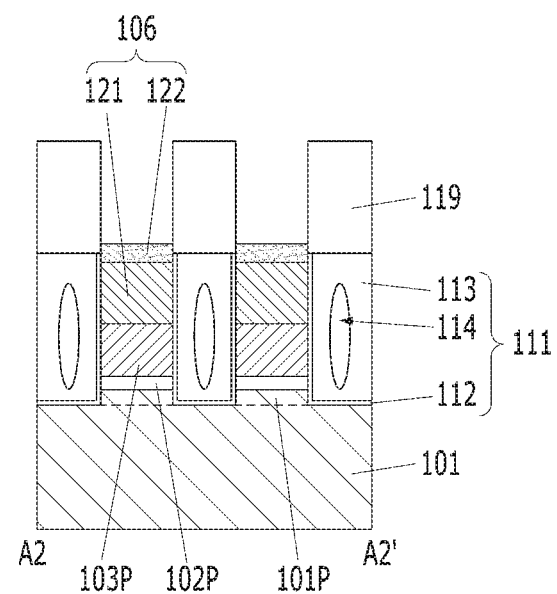

FIG. 9A is a plane view illustrating a through plug forming process, FIG. 9B is a cross-sectional view taken along the line A1-A1' shown in FIG. 9A, and FIG. 9C is a cross-sectional view taken along the line A2-A2' shown in FIG. 9A.

Referring to FIGS. 9A to 9C, the through plug 106 may fill the first contact hole 120. The through plug 106 may include a metal plug 121 and a silicon plug 122. The metal plug 121 may include a stack of titanium, titanium nitride, and tungsten. Titanium and titanium nitride may serve as barrier metals, and tungsten may serve as a plug. The silicon plug 122 may include doped polysilicon. The metal plug 121 may be formed by depositing a metal material and performing an etch-back process. The silicon plug 122 may be formed by depositing polysilicon and performing an etch-back processes. The silicon plug 122 may be doped polysilicon which is doped with a high-concentration N-type impurity. The silicon plug 122 may directly contact the active layer 105I. As a result, the impurity may diffuse into the inside of the active layer 105I from the silicon plug 122 by the subsequent annealing process.

The through plug 106 may be electrically connected to the bit line 103P.

According to another embodiment of the present invention, a protective spacer may be formed on a sidewall of the first contact hole 120 before the metal plug 121 is formed. The protective spacer may be formed by depositing silicon nitride and performing an etch-back process. The protective spacer may be formed on the sidewall of the first contact hole 120 while exposing the surface of the bit line 103P. The upper portion of the protective spacer may be positioned at a level that exposes the side of the active layer 105I, thereby providing an electrical connection between the through plug 106 and the active layer 105I. When the protective spacer is formed, at least the silicon plug 122 and the active layer 105I may be in direct contact with each other.

According to another embodiment of the present invention, the silicon plug 122 of the through plug 106 may include a raised source/drain (RSD) structure. For example, the silicon plug 122 may be formed by performing an epitaxial growth of silicon using the active layer 105I as a seed, and polysilicon doped with an impurity may be formed by the epitaxial growth process. In this case, the top surface of the silicon plug 122 may be positioned at a level higher than the active layer 105I.

According to another embodiment of the present invention, the metal silicide may be formed on the side surface of the active layer 105I that is exposed by the first contact hole 120. As a result, the critical dimension (CD) loss of the active layer 105I may be compensated for, FIG. 10A is a plane view illustrating a plug capping layer forming process, FIG. 10B is a cross-sectional view taken along the line A1-A1' shown in FIG. 10A, and FIG. 10C is a cross-sectional view taken along the line A2-A2' shown in FIG. 9A.

Figure 10A:
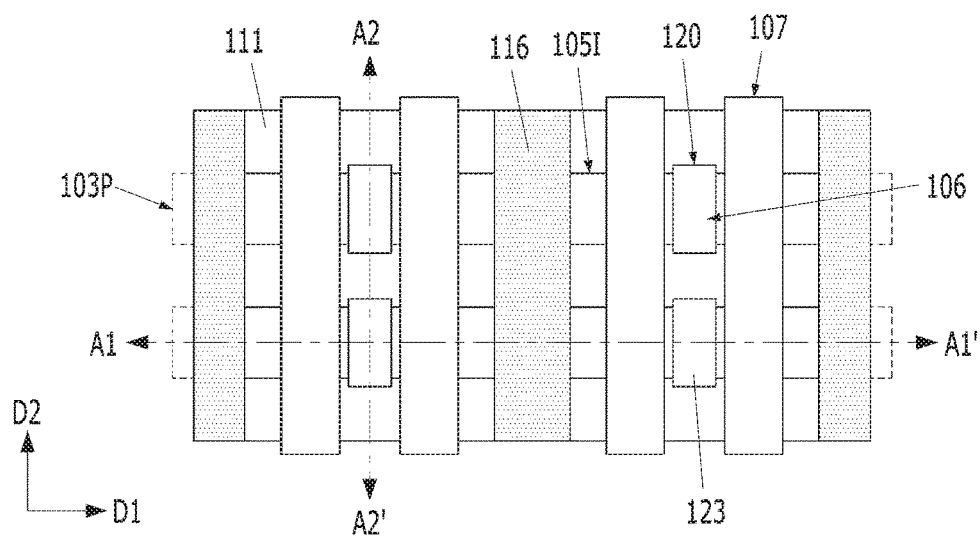
Figure 10B:
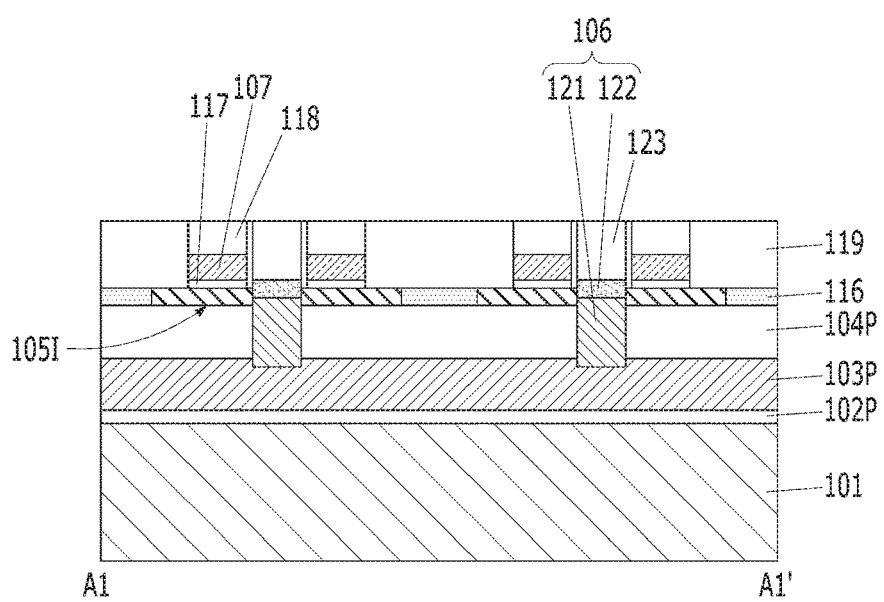
Figure 10C:
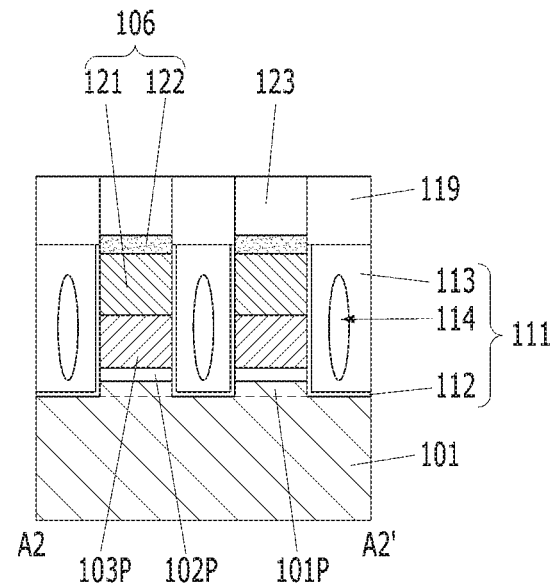

Referring to FIGS. 10A to 10C, a plug capping layer 123 may be formed over the through plug 106. The plug capping layer 123 may be formed by depositing a plug capping material over the through plug 106 and performing a planarization process. The planarization of the plug capping material may be performed until the top surface of the gate structure WL (i.e., a gate capping layer) is exposed. As a result, the inter-layer dielectric material 119 may also be planarized. The plug capping layer 123 may include silicon nitride, silicon oxynitride, or the like. The plug capping layer 123 may help securing an etch margin required for forming a subsequent capacitor.

As described above, a stack of the through plug 106 and the plug capping layer 123 may fill the first contact hole 120.

The plug capping layer 123 may protect the through plug 106 from the subsequent process.

Figure 11A:
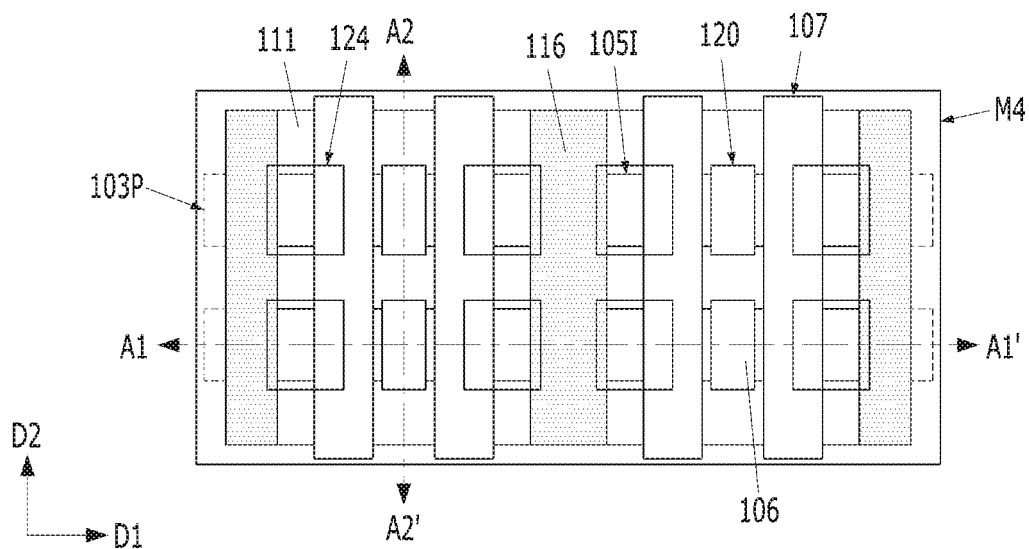
Figure 11B:
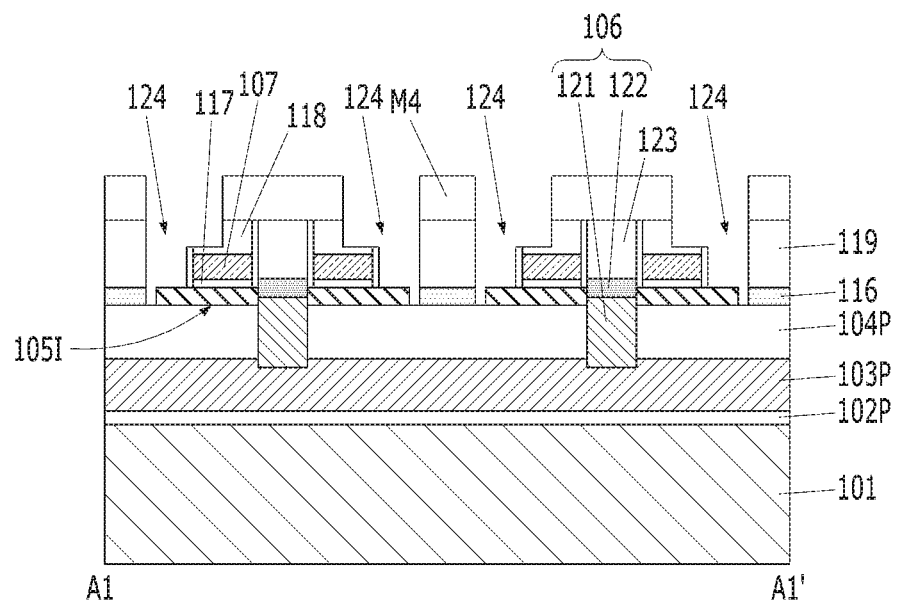
Figure 11C:
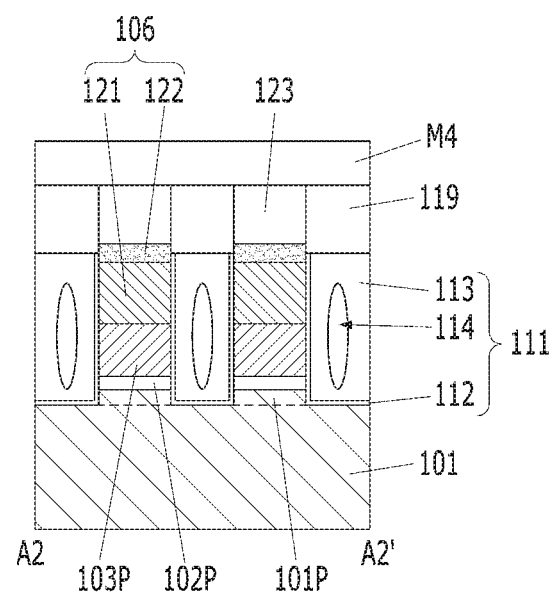

FIG. 11A is a plane view illustrating a second contact hole forming process, FIG. 11B is a cross-sectional view taken along the line A1-A1' shown in FIG. 11A, and FIG. 11C is a cross-sectional view taken along the line A2-A2' shown in FIG. 11A.

Referring to FIGS. 11A to 11C, a fourth mask M4 may be formed. The fourth mask M4 may include a photoresist pattern. The inter-layer dielectric material 119 between the gate structures may be etched by using the fourth mask M4. After the inter-layer dielectric material 119 is etched, portions of the first and second isolation layers 111 and 116 may be etched. As a result, a second contact hole 124 may be formed. The second contact hole 124 may expose both sides of the active layer 105I. The second contact hole 124 may expose top surfaces and edges of both sides of the active layer 105I. From the perspective of a top view, the second contact hole 124 may have a rectangular or ellipse shape. The bottom surface of the second contact hole 124 may expose the top surface of the buried dielectric line 104P.

The upper end of the second contact hole 124 may extend to vertically overlap with the gate structure WL. For example, a portion of the gate capping layer 118 may be etched when the inter-layer dielectric material 119 is etched by using the fourth mask M4. Even though a portion of the gate capping layer 118 is etched, the word line 107 may not be exposed. The second contact hole 124 may have a shape in which an upper portion thereof is wider than a lower portion thereof.

Figure 12A:
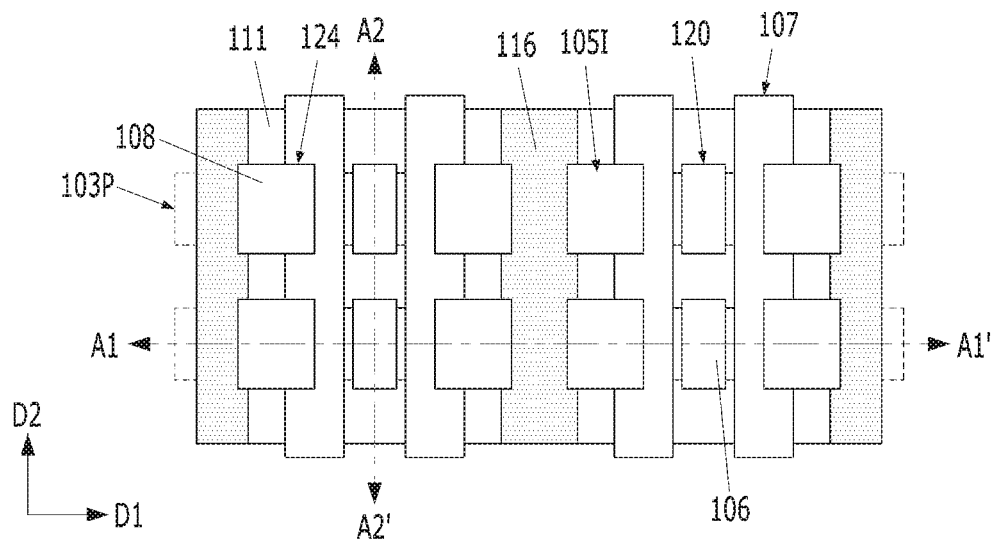
Figure 12B:
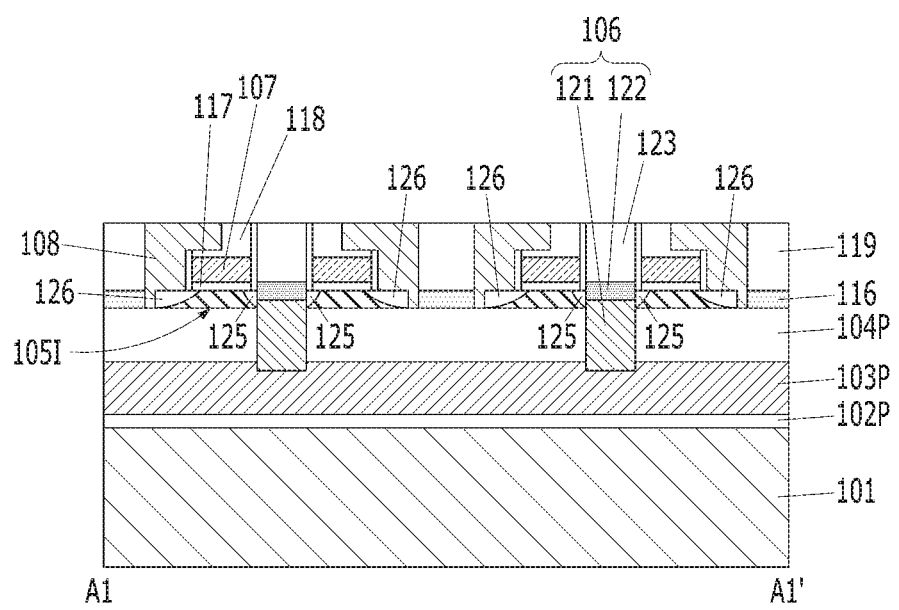
Figure 12C:
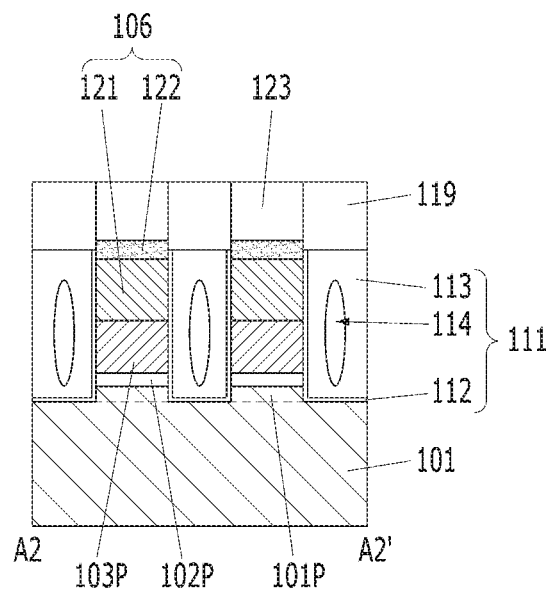

FIG. 12A is a plane view illustrating a vertical plug forming process, FIG. 12B is a cross-sectional view taken along the line A1-A1' shown in FIG. 12A, and FIG. 12C is a cross-sectional view taken along the line A2-A2' shown in FIG. 12A.

Referring to FIGS. 12A to 12C, the vertical plug 108 may fill the second contact hole 124. The vertical plug 108 may be formed by depositing a conductive material and performing an etch-back process. The vertical plug 108 may include doped polysilicon, metal, a metal nitride, a metal silicide, or a combination thereof. The vertical plug 108 may include doped polysilicon which is doped with a high-concentration N-type impurity.

According to another embodiment of the present invention, the vertical plug 108 may include a raised source/drain (RSD) structure. For example, epitaxial growth of silicon may be performed by using the active layer 105I as a seed to form the vertical plug 108, and polysilicon doped with an impurity may be formed by the epitaxial growth.

Subsequently, an annealing process may be performed. By the annealing process, the impurity may be diffused from the silicon plug 122 and the vertical plug 108 into the active layer 105I.

For example, the N-type impurity may be diffused from the silicon plug 122 to form a first impurity region 125. Also, the N-type impurity may be diffused into the inside of both sides of the active layer 105I from the vertical plug 108 to form a second impurity region 126.

The first impurity region 125 and the second impurity region 126 may be referred to as source/drain regions. The first impurity region 125 and the bit line 103P may be electrically connected through the through plug 106.

The first impurity region 125, the second impurity region 126, the active layer 105I, and the word line 107 may form a transistor. The word line 107 may have a planar gate structure. According to another embodiment of the present invention, the word line 107 may have a fin gate structure or a vertical gate structure.

The thickness of the active layer 105I may be formed to be smaller than approximately 10 nm so as to form an FDSOI MOSFET structure.

Figure 13A:
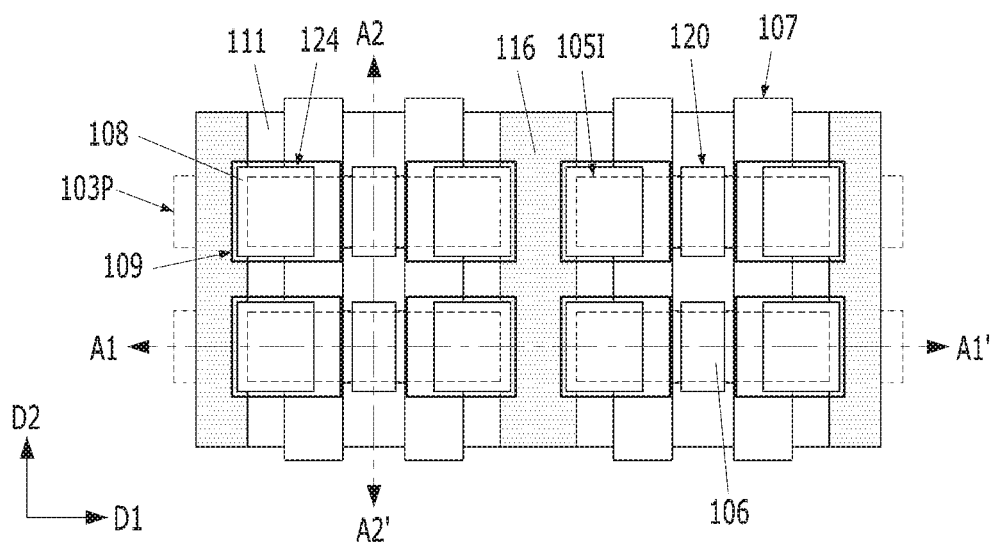
Figure 13B:
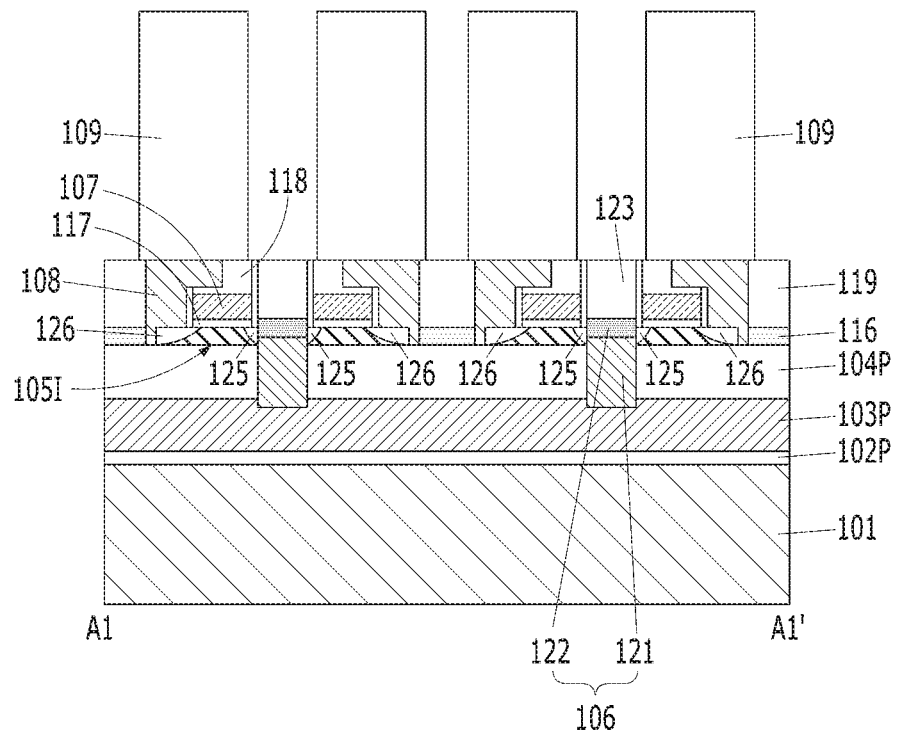
Figure 13C:
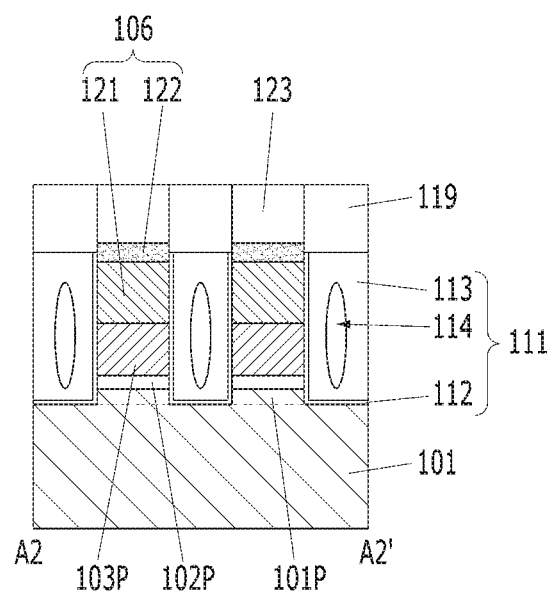

FIG. 13A is a plane view illustrating a capacitor forming process, FIG. 13B is a cross-sectional view taken along the line A1-A1' shown in FIG. 13A, and FIG. 13C is a cross-sectional view taken along the line A2-A2' shown in FIG. 13A.

A capacitor 109 may be formed over each vertical plug 108. The capacitor 109 and the second impurity region 126 may be electrically connected through the vertical plug 108. The capacitor 109 may be a three-dimensional structure including a pillar-shaped structure, a cylindrical structure, or a combination thereof. Since the through plug 106 is not positioned in the space between the neighboring capacitors 109, the space between the capacitors 109 may be narrowed sufficiently. Therefore, the size of the capacitor 109 may be increased so that a portion of the capacitor 109 may extend to vertically overlap with the word line 107. As a result, since the area of the capacitor 109 may be further secured, the capacitance may be increased.

Also, since the bit line 103P is formed to be buried at a level lower than the capacitor 109, the capacitor 109 may be easily arranged. Therefore, the integration degree of memory cells may be increased.

FIGS. 14A to 14D illustrate a method for forming the substrate stack 101L.

Figure 14A:
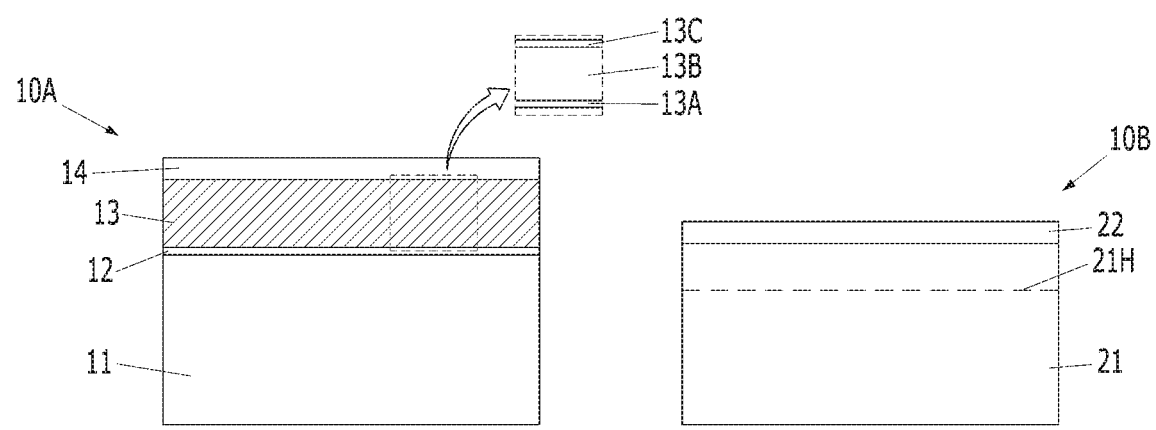
FIGS. 14A to 14D illustrate a method for forming a substrate stack.

Referring to FIG. 14A, a first substrate 10A and a second substrate 10B may be prepared.

The first substrate 10A may include a first bulk silicon 11, a first dielectric material 12, and a conductive material 13. The first insulating material 12 may be formed over a top surface of the first bulk silicon 11. The conductive material 13 may be formed over the top surface of the first dielectric material 12. The first dielectric material 12 may directly contact the first bulk silicon 11, and the conductive material 13 may directly contact the first dielectric material 12.

The first dielectric material 12 may be deposited over the first bulk silicon 11. The first dielectric material 12 may be deposited by Chemical Vapor Deposition, Atomic Layer Deposition, or the like. The first dielectric material 12 may include an oxide, for example, silicon oxide. According to another embodiment of the present invention, the first dielectric material 12 may be a native oxide that exposes the first bulk silicon 11 to the air.

The conductive material 13 may be deposited over the first dielectric material 12. The conductive material 13 may be deposited by Chemical Vapor Deposition, Atomic Layer Deposition, or the like. The conductive material 13 may include a metal-based material. The conductive material 13 may include a metal, a metal nitride, a metal silicide, or a combination thereof. For example, the conductive material 13 may include barrier metal layers 13A and 13C and a metal layer 13B. The barrier metal layers 13A and 13C may include a lower barrier metal layer 13A and an upper barrier metal layer 13C. The barrier metal layers 13A and 13C may include a stack (Ti/TiN) of titanium and titanium nitride. The metal layer 13B may be positioned between the lower barrier metal layer 13A and the upper barrier metal layer 13C. The metal layer 13B may include tungsten. The conductive material 13 may be a stack of Ti/TiN and tungsten (Ti/TiN/W/Ti/TiN).

The first substrate 10A may further include a first bonding material 14. The first bonding material 14 may be formed over the top surface of the conductive material 13. The first bonding material 14 may include a dielectric material. The first bonding material 14 may include silicon oxide. The first bonding material 14 may be thicker than the first dielectric material 12.

As described above, the first substrate 10A may include a sequential stack where the first bulk silicon 11, the first dielectric material 12, the conductive material 13, and the first bonding material 14 are stacked in the mentioned order.

The second substrate 10B may include a second bulk silicon 21 and a second bonding material 22. Hydrogen ions 21H may be implanted into the surface of the second bulk silicon 21. The second bonding material 22 may be formed over the top surface of the second bulk silicon 21. The second bonding material 22 may include a dielectric material. The second bonding material 22 may include silicon oxide. The hydrogen ions 21H may maintain a strong bonding force between the first substrate 10A and the second substrate 10B.

Figure 14B:
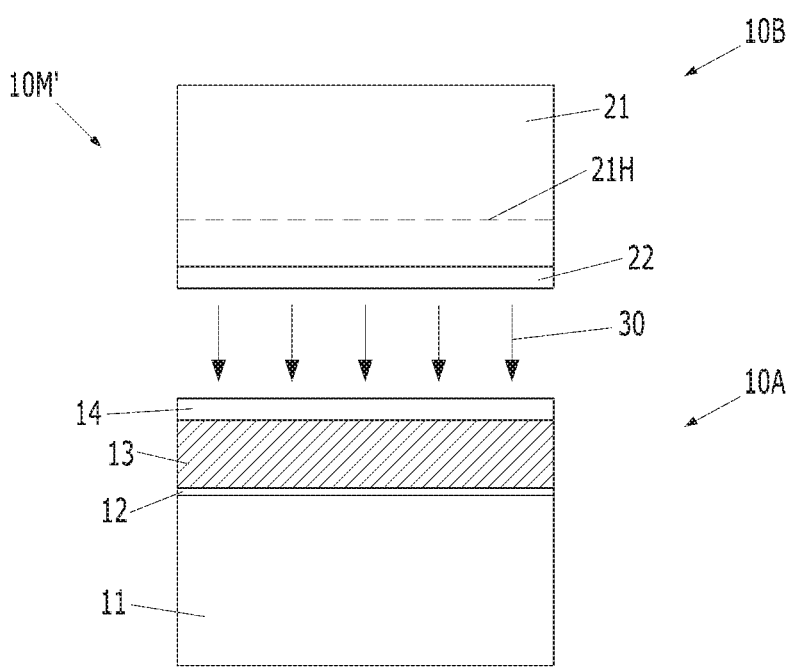

Referring to FIG. 14B, the first substrate 10A and the second substrate 10B may be bonded to each other through a substrate-to-substrate bonding process 30.

The first bonding material 14 of the first substrate 10A may be bonded to the second bonding material 22 of the second substrate 10B.

Figure 14C:
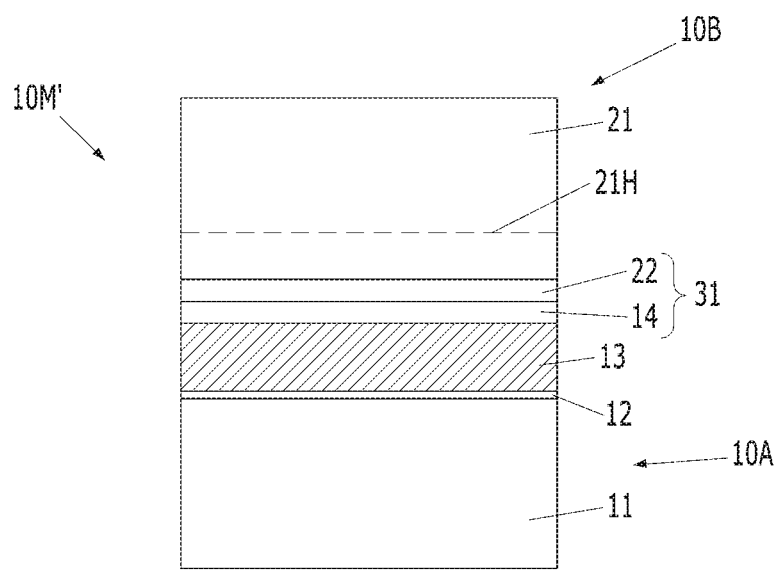

Accordingly, as shown in FIG. 14C, an initial substrate stack 10M' may be formed. The initial substrate stack 10M' may have a bonding structure between the first substrate 10A and the second substrate 10B. The stack of the first bonding material 14 and the second bonding material 22 bonded to each other may be simply referred to as a buried dielectric material 31.

The uppermost surface of the initial substrate stack 10M may correspond to the backside of the second substrate 10B. The backside of the second substrate 10B may be the backside of the second bulk silicon 21.

Figure 14D:
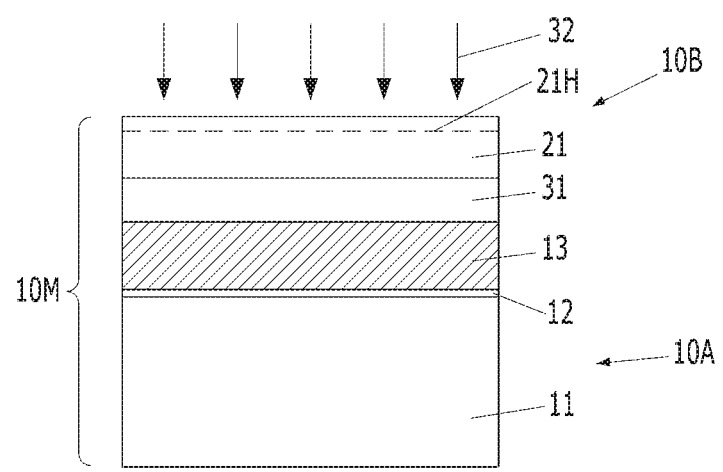

Referring to FIG. 14D, an annealing process may be performed. The annealing process may be performed at approximately 600° C.

Subsequently, the backside of the second substrate 10B may be planarized 32. As a result of the planarization 32, the backside of the second bulk silicon 21 may be planarized. The planarized second bulk silicon 21 may have a thickness of approximately 25 to 50 nm. A Chemical Mechanical Polishing (CMP) process may be performed to planarize 32 the backside of the second bulk silicon 21. The planarization 32 may not expose the hydrogen ions 21H.

After the planarization 32 process described above, a thin substrate stack 10M may be formed. The substrate stack 10M may be thinner than the initial substrate stack 10M'.

The substrate stack 10M may include the first bulk silicon 11 and the second bulk silicon 21, and the conductive material 13 may be formed between the first bulk silicon 11 and the second bulk silicon 21.

The conductive material 13 may be insulated from the second bulk silicon 21 by the buried dielectric material 31. The conductive material 13 may be insulated from the first bulk silicon 11 by the buffer material 12. The conductive material 13 may have a shape that is buried between the first bulk silicon 11 and the second bulk silicon 21.

The second bulk silicon 21, which is the uppermost layer of the substrate stack 10M, may be formed extremely thin. The second bulk silicon 21 may have a thickness of approximately 10 nm or less. The thin thickness may suppress the floating body effect.

The thickness of the buried dielectric material 31 may be approximately 25 nm or less.

The substrate stack 10M may correspond to the substrate stack 101L of FIG. 2A. The first bulk silicon 11 of the substrate stack 10M may correspond to a bulk material 101 of FIG. 2A. The second bulk silicon 21 of the substrate stack 10M may correspond to a semiconductor material 105 shown in FIG. 2A. The conductive material 13 of the substrate stack 10M may correspond to the conductive material 103 of FIG. 2A. The buffer material 12 of the substrate stack 10M may correspond to the buffer material 102 of FIG. 2A. The buried dielectric material 31 of the substrate stack 10M may correspond to the buried dielectric material 104 of FIG. 2A.

Figure 15:
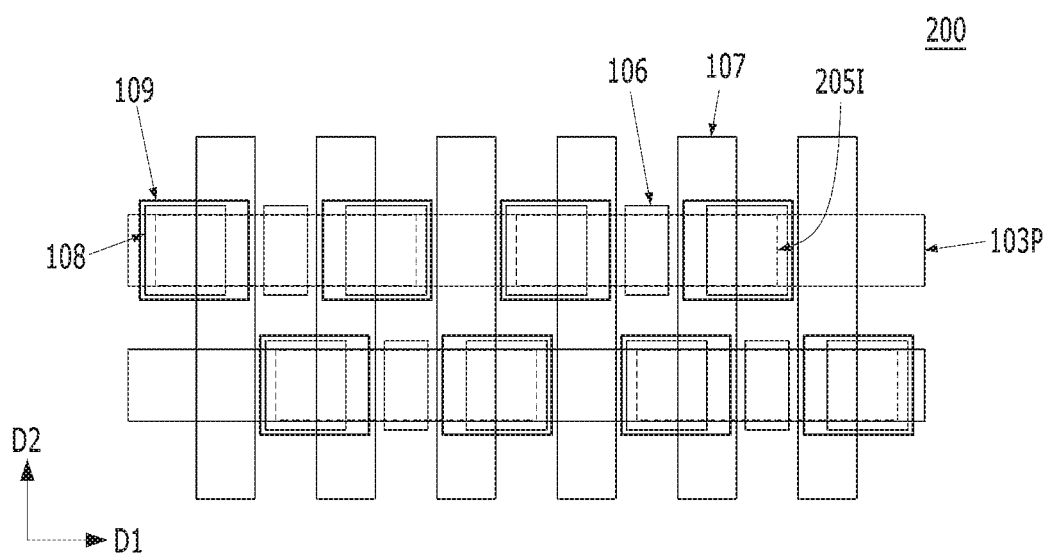
FIGS. 15 to 17 are plane views illustrating semiconductor devices in accordance with other embodiments of the present invention.

FIG. 15 is a plane view illustrating a semiconductor device in accordance with another embodiment of the present invention.

Referring to FIG. 15, the semiconductor device 200 is a portion of a memory cell, and the semiconductor device 200 may include a bit line 103P, an active layer 205I that is vertically insulated from the bit line 103P, a through plug 106 that is coupled to the bit line 103P by penetrating the active layer 205I, a pair of word lines 107 that are parallel to each other over the active layer 105I, a pair of vertical plugs 108 that are coupled to both sides of the active layer 205I respectively, and capacitors 109 that are coupled to each other over the vertical plug 108.

The active layer 105I shown in FIG. 1A may be arranged in a regular array, and the active layer 205I shown in FIG. 15 may be arranged in a zigzag array. Accordingly, the through plug 106, the vertical plug 108, and the capacitor 109 may also be arranged in a zigzag array.

Also, some of the word lines 107 may go across between the neighboring active layers 205I.

The semiconductor devices 100 and 200 in accordance with the above embodiments of the present invention may be applied to the memory cells of a $4F^2$ DRAM.

The transistors of the semiconductor devices 100 and 200 may be planar gate transistors.

According to other embodiments of the present invention, the transistors of the semiconductor devices 100 and 200 may include a vertical gate transistor or a FinFET.

Figure 16:
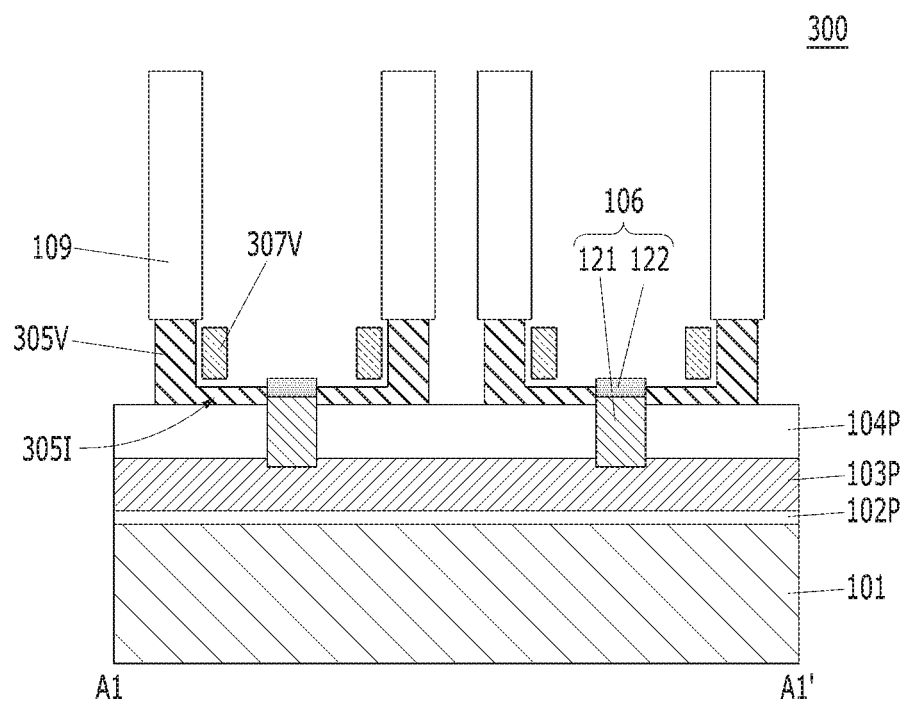

FIG. 16 is a cross-sectional view illustrating a semiconductor device in accordance with another embodiment of the present invention.

Referring to FIG. 16, a semiconductor device 300 may be a portion of a memory cell, and the semiconductor device 300 may include a horizontal active layer 305I and a pillar-type active layer 305V that extends vertically from both ends of the horizontal active layer 305I. A word line 307V may extend perpendicularly to the horizontal active layer 305I along the sidewall of the pillar-type active layer 305V. The word line 307V may not contact the horizontal active layer 305I and the pillar-type active layer 305V. A vertical channel may be defined in the vertical active layer 305V by the word line 307V.

The pillar-type active layer 305V may be formed by epitaxial growth from the side of the horizontal active layer 305I. According to another embodiment of the present invention, the pillar-type active layer 305V and the horizontal active layer 305I may be formed by increasing the thickness of the initial active layer and then etching the initial active layer.

The word line 307V, which is described above, may be a vertical gate.

Figure 17:
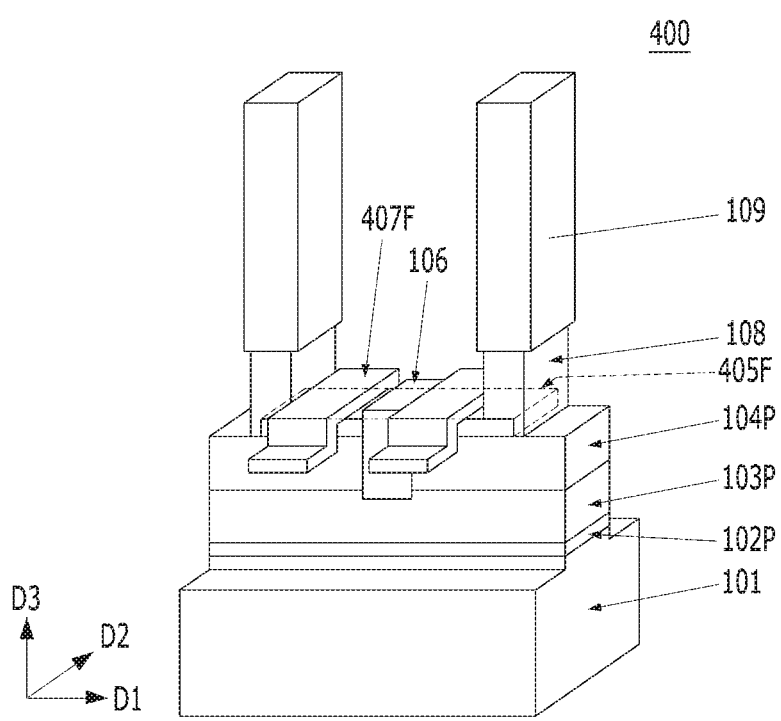

FIG. 17 is a perspective diagram illustrating a semiconductor device in accordance with another embodiment of the present invention.

Referring to FIG. 17, the semiconductor device 400 may be a portion of a memory cell, and the other constituent elements except for word lines 407F may be similar to those of the semiconductor device 100 shown in FIG. 1A.

The word lines 407F may have a shape that intersects with a fin active layer 405F. For example, neighboring fin active layers 405F may be spaced apart from each other by a predetermined distance, and the word lines 407F may be formed in the upper portions of the neighboring fin active layers 405F.

A buried dielectric line 104P may be formed below the fin active layer 405F, and a bit line 103P may be formed below the buried dielectric line 104P. A buffer line 102P may be formed below the bit line 103P, and a bulk substrate 101 may be formed below the buffer line 102P. The buffer line 102P, the bit line 103P, and the buried dielectric line 104P may be sequentially stacked over the bulk substrate 101. The buffer line 102P and the buried dielectric line 104P may include silicon oxide. The bit line 103P may have a shape buried between the buried dielectric line 104P and the buffer line 102P. The bit line 103P and the bulk substrate 101 may be insulated from each other by the buffer material 102P.

Figure 18A:
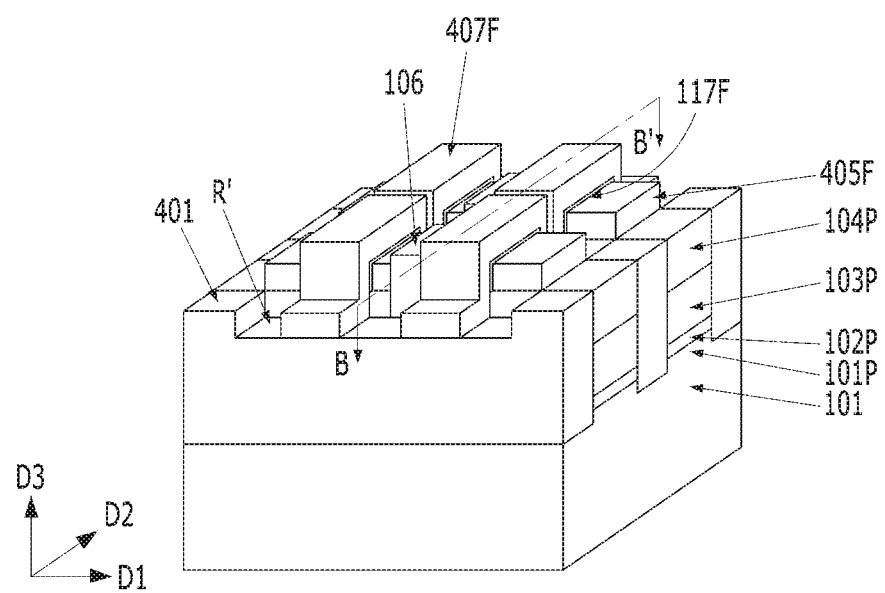
FIGS. 18A and 18B illustrate a word line shown in FIG. 17.
Figure 18B:
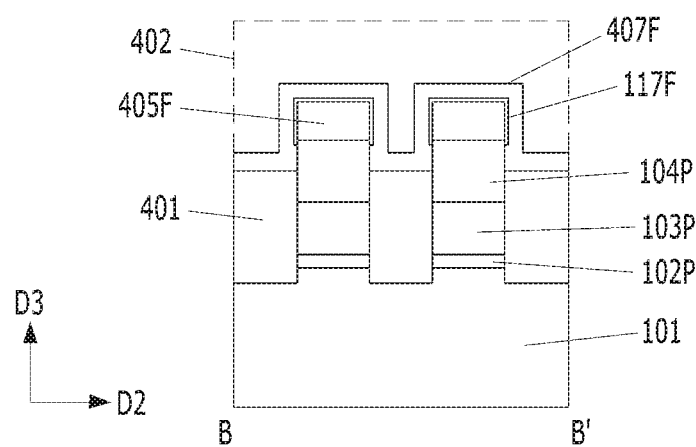

FIGS. 18A and 18B illustrate a word line shown in FIG. 17.

FIG. 18A is a perspective view, and FIG. 18B is a cross-sectional view taken along a line B-B' shown in FIG. 18A.

Referring to FIGS. 18A and 18B, an isolation layer 401 including a recess R' may be formed between the neighboring active layers 105I, and the recess R' of the isolation layer 401 may be recessed to be lower than the top surface of the buried dielectric line 104P. The top surface and both sidewalls of the fin active layer 405F may be exposed by the recess R' of the isolation layer 401. The isolation layer 401 may include silicon nitride. The isolation layer 401 may insulate the neighboring bit lines 103P from each other. The isolation layer 401 may correspond to the first isolation layer 111 of the above-described embodiments of the present invention. According to another embodiment of the present invention, the isolation layer 401 may include an air gap (not shown) inside.

In order to form the recess R' of the isolation layer 401, a portion of the first isolation layer 111 may be selectively recessed to a predetermined depth after a cutting process of the active layer 105I of FIGS. 5A to 5C. According to another embodiment of the present invention, after forming the second isolation layer 116 of FIGS. 6A to 6C, a portion of the first isolation layer 111 may be selectively recessed to a predetermined depth.

The word lines 407F may be formed to intersect with the recess portion R' of the isolation layer 401 and the fin active layer 405F. The gate dielectric layer 117F may be formed on the top surface and sidewalls of the fin active layer 405F. The gate dielectric layer 117F may be formed by selectively oxidizing the surface of the fin active layer 405F. A portion of a word line 407F may contact a sidewall of a buried dielectric line 104P. A through plug 106 penetrating the fin active layer 405F may be formed between the neighboring word lines 407F.

According to another embodiment of the present invention, a conductive layer 402 may be further formed over the word line 407F. The conductive layer 402 may fill between the neighboring fin active layers 405F over the word line 407F.

As described above, the word line 407F may be a fin gate.

Figure 19A:
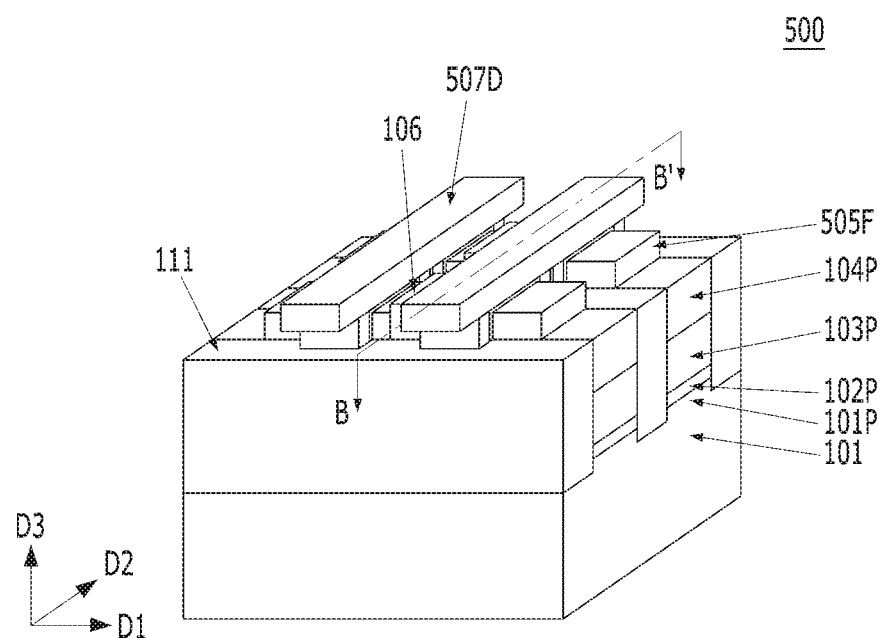
FIGS. 19A and 19B illustrate a semiconductor device in accordance with another embodiment of the present invention.
Figure 19B:
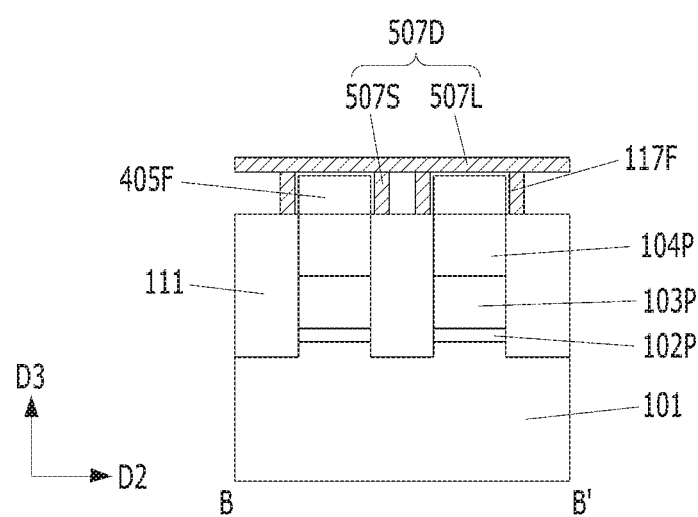

FIGS. 19A and 19B illustrate a semiconductor device 500 in accordance with another embodiment of the present invention. FIG. 19A is a perspective view of the semiconductor device 500, and FIG. 19B is a cross-sectional view taken along the line B-B' shown in FIG. 19A.

Referring to FIGS. 19A and 19B, the semiconductor device 500 may be a portion of a memory cell, and the other constituent elements of the semiconductor device 500 except for word lines 507D may be similar to those of the semiconductor device 100 shown in FIG. 1A.

The word lines 507D may have a shape that intersects with a fin active layer 505F. For example, the neighboring fin active layers 505F may be spaced apart from each other by a predetermined distance, and the word lines 507D may be formed in the upper portions of the neighboring fin active layers 505F.

A word line 507D may be a fin gate and may include a vertical portion 507S and a line portion 507L. The vertical portion 507S may be formed on both sidewalls of the fin active layer 505F. The vertical portions 507S that are disposed adjacent to each other in the first direction D1 may be separated from each other. The vertical portions 507S that are disposed adjacent to each other in the second direction D2 may be electrically connected to each other by the line portion 507L. The line portion 507L may extend along in the second direction D2. A vertical channel may be formed in the fin active layer 505F by the vertical portion 507S.

To form the vertical portion 507S, the first isolation layer 111 may be recessed to a predetermined depth. The buried dielectric line 104P may also be recessed to a predetermined depth. Since the first isolation layer 111 and the buried dielectric line 104P are recessed, the fin active layer 505F may be defined. A gate dielectric layer 117F may be formed on both sidewalls and the top surface of the fin active layer 505F.

Figure 20:
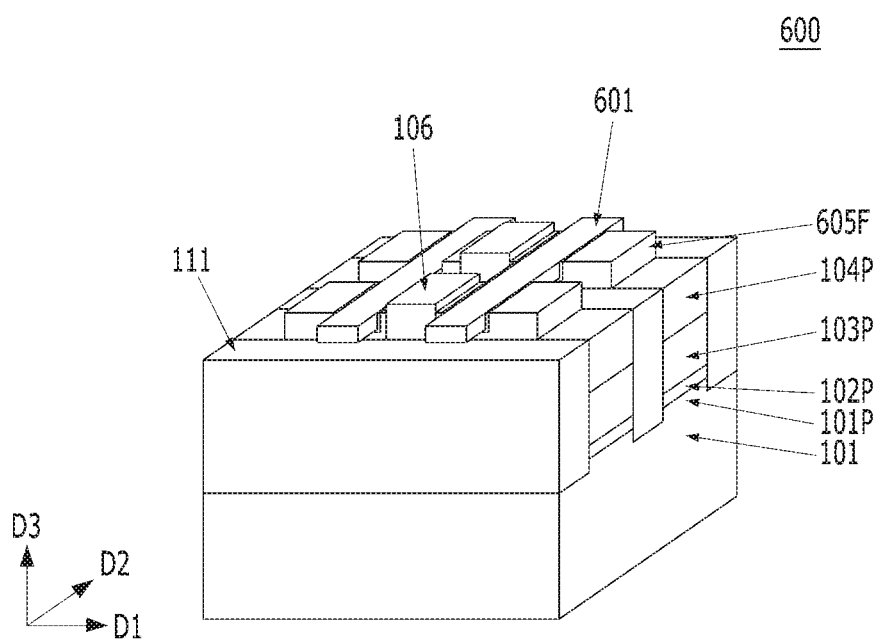
FIG. 20 is a perspective view illustrating a semiconductor device in accordance with another embodiment of the present invention.

FIG. 20 is a perspective view illustrating a semiconductor device 600 in accordance with another embodiment of the present invention.

Referring to FIG. 20, the semiconductor device 600 may be a portion of a memory cell, and the other constituent elements of the semiconductor device 600 except for word lines 601 and a fin active layer 605F may be similar to those of the semiconductor device 100 shown in FIG. 1A.

A gate trench (not given with a reference numeral) extending in the second direction D2 may be formed in the fin active layer 605F. The word lines 601 may be buried in the gate trench. The top surfaces of the word lines 601 may be at the same level as the top surface of the fin active layer 605F. The word lines 601 may be referred to as 'buried word lines'. According to another embodiment of the present invention, a recessing process of the first isolation layer 111 may be performed before the word lines 601 are formed so that the fin active layer 605F has a saddle fin structure.

According to another embodiment of the present invention, the word lines 601 may be buried in the island-shaped active layer 105I of the above-described embodiments other than the fin active layer 605F. In this case, the recessing process of the first isolation layer 111 may be omitted.

As described above, the word lines 601 may be buried gates.

According to the embodiments of the present invention, the layout area of a memory cell may be reduced by forming bit lines under transistors and capacitors.

According to the embodiments of the present invention, process margins for forming capacitors may be secured by using self-aligned buried bit lines.

According to the embodiments of the present invention, capacitance may be further secured by increasing the size of the capacitor.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
    a stacked line structure including a bit line, the stacked line structure positioned over a substrate;
    an active layer positioned at a higher level than the stacked line structure and parallel to the bit line;
    a capacitor positioned at a higher level than the active layer;
    a first plug extending through the active layer to be coupled to the bit line;
    a second plug formed between the active layer and the capacitor to couple the active layer to the capacitor; and
    a word line extending in a direction that intersects with the bit line and the active layer,
    wherein the active layer extends parallel to the bit line, and
    wherein the first plug electrically connects the active layer to the bit line.

2. The semiconductor device of claim 1, wherein the stacked line structure includes:
    a buried dielectric line formed between the bit line and the active layer;
    a buffer line formed between the bit line and the substrate; and
    a protrusion positioned below the buffer line to protrude from the substrate,
    wherein the buried dielectric line is vertically positioned between the active layer and the bit line.

3. The semiconductor device of claim 2, wherein the first plug is coupled to the bit line through the buried dielectric line.

4. The semiconductor device of claim 1, wherein a lower portion of the second plug extends to cover an edge side of the active layer.

5. The semiconductor device of claim 1, wherein an upper portion of the second plug extends to vertically overlap with the word line.

6. The semiconductor device of claim 1, wherein a top surface of the first plug is positioned at a lower level than the word line.

7. The semiconductor device of claim 1, wherein the bit line includes a metal-based material.

8. The semiconductor device of claim 1, wherein the first plug includes a metal plug coupled to the bit line and a polysilicon plug doped with an impurity of the metal plug.

9. The semiconductor device of claim 1, wherein each of the first plug and the second plug includes polysilicon doped with an impurity.

10. The semiconductor device of claim 9, wherein the active layer includes a first source/drain region coupled to the first plug and a second source/drain region coupled to the second plug, and
    wherein the first source/drain region and the second source/drain region are doped with the impurity diffused from the polysilicon doped with the impurity.

11. The semiconductor device of claim 1, wherein the word line includes a pair of word lines are parallel to each other, and the pair of word lines are disposed over the active layer.

12. The semiconductor device of claim 1, wherein the word line is positioned at a higher level than the bit line and the active layer.

13. The semiconductor device of claim 1, wherein the active layer is vertically overlap with the bit line.

14. The semiconductor device of claim 1, further comprises:
    an isolation layer surrounding sidewalls of the active layer.

15. The semiconductor device of claim 14, wherein the isolation layer includes:
    a first isolation layer including an air gap positioned on both sidewalls of the stacked line structure; and
    a second isolation layer formed on a second pair of sidewalls of the active layer,
    wherein the first isolation layer extends to cover a first pair of sidewalls of the active layer.

16. The semiconductor device of claim 15, wherein the stacked line structure includes a plurality of stacked line structures, and the first isolation layer is disposed between the stacked line structures.

17. The semiconductor device of claim 15, wherein the active layer includes a plurality of active layers, and the second isolation layer is disposed between the active layers.

18. The semiconductor device of claim 1, wherein the second plug includes a pair of second plugs are apart from each other, and the second plugs are directly contacted with the active layer.

19. The semiconductor device of claim 1, wherein the word line includes a planar gate, a fin gate, a vertical gate, or a buried gate.

* * * * *